(12) United States Patent
Kim et al.

(10) Patent No.: US 11,988,712 B2
(45) Date of Patent: May 21, 2024

(54) MULTI-BIT FLIP-FLOP AND INTEGRATED CIRCUIT INCLUDING THE SAME

(71) Applicant: SAMSUNG ELECTRONICS CO., LTD., Suwon-si (KR)

(72) Inventors: Chunghee Kim, Yongin-si (KR); Ahreum Kim, Daegu (KR); Minsu Kim, Hwaseong-si (KR); Seungman Lim, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/551,974

(22) Filed: Dec. 15, 2021

(65) Prior Publication Data

US 2022/0334182 A1 Oct. 20, 2022

(30) Foreign Application Priority Data

Apr. 14, 2021 (KR) .................. 10-2021-0048673

(51) Int. Cl.
*G01R 31/3185* (2006.01)
(52) U.S. Cl.
CPC .................. *G01R 31/318541* (2013.01)
(58) Field of Classification Search
None
See application file for complete search history.

(56) References Cited

U.S. PATENT DOCUMENTS

| | | | |
|---|---|---|---|
| 5,490,151 A * | 2/1996 | Feger | G01R 31/318541 |
| | | | 714/727 |
| 6,986,089 B2 * | 1/2006 | Hill | G01R 31/31721 |
| | | | 711/109 |
| 7,665,001 B2 * | 2/2010 | Baik | G01R 31/318541 |
| | | | 714/726 |
| 7,971,165 B2 | 6/2011 | Yabumoto et al. | |
| 9,087,170 B2 | 7/2015 | Hsu et al. | |
| 10,338,139 B1 * | 7/2019 | Ge | G01R 31/318541 |
| 10,509,882 B2 | 12/2019 | Lin et al. | |
| 11,126,781 B2 * | 9/2021 | Kim | G06F 30/392 |
| 11,275,886 B2 * | 3/2022 | Chen | G06F 30/337 |

(Continued)

FOREIGN PATENT DOCUMENTS

| | | |
|---|---|---|
| JP | 1994-204435 | 7/1994 |
| JP | 2006-310469 | 11/2006 |

(Continued)

OTHER PUBLICATIONS

Fabian Klass, et al., "A New Family of Semidynamic and Dynamic Flip-Flops with Embedded Logic for High-Performance Processors", IEEE Journal of Solid-State Circuits, vol. 34, No. 5, May 1999.

(Continued)

*Primary Examiner* — Steve N Nguyen
(74) *Attorney, Agent, or Firm* — F. Chau & Associates, LLC

(57) ABSTRACT

A multi-bit flip-flop includes a first flip-flop having a first output driver connected to a first output pin and arranged on a first row, a second flip-flop including a second output driver electrically connected to a second output pin and arranged on a second row, and an internal hold buffer connected to the first output driver on the first row and the second flip-flop on the second row.

19 Claims, 24 Drawing Sheets

(56) References Cited

U.S. PATENT DOCUMENTS

| | | | |
|---|---|---|---|
| 2001/0042921 A1* | 11/2001 | Mori | H01L 21/76877 |
| | | | 438/622 |
| 2002/0184560 A1* | 12/2002 | Wang | G01R 31/31704 |
| | | | 714/25 |
| 2003/0167430 A1* | 9/2003 | Barbera | G01R 31/318541 |
| | | | 714/727 |
| 2011/0227609 A1 | 9/2011 | Kushiyama | |
| 2012/0239847 A1* | 9/2012 | Gaskins | G06F 15/76 |
| | | | 710/306 |
| 2017/0292993 A1* | 10/2017 | Yoon | G01R 31/31725 |
| 2017/0371539 A1* | 12/2017 | Mai | G06F 3/0656 |
| 2020/0097634 A1 | 3/2020 | Chen et al. | |
| 2020/0099368 A1 | 3/2020 | Wang et al. | |
| 2021/0033669 A1* | 2/2021 | Cheng | G01R 31/3177 |

FOREIGN PATENT DOCUMENTS

| | | |
|---|---|---|
| JP | 2008-262337 | 10/2008 |
| JP | 2011-196855 | 10/2011 |
| JP | 2012-137890 | 7/2012 |
| KR | 10-0635513 | 10/2006 |

OTHER PUBLICATIONS

Min-su Kim et al., "Scan-controlled pulse flip-flops for mobile application processors", 2013 IEEE International Symposium on Circuits and Systems (ISCAS).

* cited by examiner

MULTI-BIT FLIP-FLOP AND INTEGRATED CIRCUIT INCLUDING THE SAME

CROSS-REFERENCE TO RELATED APPLICATION

This application claims priority under 35 U.S.C. § 119 to Korean Patent Application No. 10-2021-0048673, filed on Apr. 14, 2021, in the Korean Intellectual Property Office, the disclosure of which is incorporated by reference herein in its entirety.

FIELD

The present disclosure relates to an integrated circuit, and more particularly, to a multi-bit flip-flop and an integrated circuit including the same.

DISCUSSION OF RELATED ART

Due to increasingly high integration of semiconductor chips, a multi-bit flip-flop, which refers to two or more flip-flops implemented as a single cell, has been suggested. Technology of design for testability (DFT) for maintaining the quality of semiconductor chips and improving the test efficiency has been widely used, and among others, the scan test technologies have comprised a significant portion thereof.

SUMMARY

The present disclosure provides a multi-bit flip-flop with an internal hold buffer which is efficiently arranged and used for scan tests.

According to an embodiment of the present disclosure, there is provided a multi-bit flip-flop including a scan input pin; a first data input pin; a second data input pin; a first output pin; a second output pin; a first flip-flop arranged on a first row, including a first input buffer electrically connected with the scan input pin and the first data input pin, and a first output driver electrically connected with the first output pin; a second flip-flop arranged on a second row different than the first row, including a second input buffer electrically connected with the second data input pin, and a second output driver electrically connected with the second output pin; and an internal hold buffer electrically connected to the first output driver on the first row and the second input buffer on the second row.

According to an embodiment of the present disclosure, there is provided a multi-bit flip-flop including: a plurality of data input pins configured to receive a plurality of data input signals including at least a first data input signal and a second data input signal, respectively; a first flip-flop configured to generate a first input signal corresponding to any one of the scan input signal and the first data input signal according to the scan enable signal, generate a first internal signal by latching the first input signal, and output a first output signal corresponding to the first internal signal; an internal hold buffer configured to generate a second internal signal by buffering the first internal signal; a second flip-flop configured to generate a second input signal corresponding to any one of the second internal signal and the second data input signal according to the scan enable signal, and generate a second output signal based on the second input signal; and a plurality of output pins configured to output a plurality of output signals including at least the first output signal and the second output signal, respectively.

BRIEF DESCRIPTION OF THE DRAWINGS

Embodiments of the present disclosure will be more clearly understood from the following detailed description taken in conjunction with the accompanying drawings, in which.

DETAILED DESCRIPTION OF EMBODIMENTS

Hereinafter, embodiments of the present disclosure will be described in detail with reference to the accompanying drawings.

Figure 1:
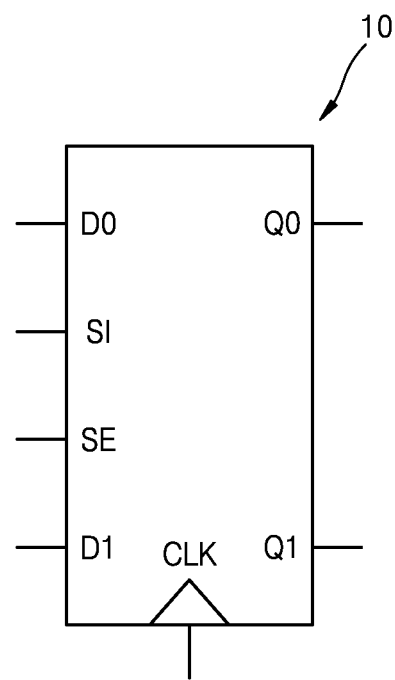
FIG. 1 is a block diagram of a multi-bit flip-flop according to an exemplary embodiment.

FIG. 1 illustrates a multi-bit flip-flop according to an exemplary embodiment.

With reference to FIG. 1, a multi-bit flip-flop 10 may receive a first data input signal D0, a second data input signal D1, and a scan input signal SI, and select the first data input signal D0, the second data input signal D1, or the scan input signal SI according to a scan enable signal SE. The multi-bit flip-flop 10 may latch the selected signal according to a clock signal CLK and output a first output signal Q0 and a second output signal Q1 corresponding to the latched signal.

In one embodiment, the multi-bit flip-flop 10 may receive two data input signals and output two output signals. However, the present disclosure is not limited thereto. In other embodiments, the multi-bit flip-flop 10 may receive N data input signals and output N output signals as an N-bit flip-flop. Here, N is an integer greater than or equal to 2.

In one embodiment, the multi-bit flip-flop 10 may receive one scan input signal SI regardless of the number of data input signals. Accordingly, the multi-bit flip-flop 10 may be referred to as a multi-bit single scan-in flip-flop.

The scan enable signal SE may be a signal for indicating a first operation mode or a second operation mode according to a logic level. Specifically, when the scan enable signal SE has a first logic level (e.g., a logic low level), the scan enable signal SE may indicate the first operation mode. When the scan enable signal SE has a second logic level (e.g., a logic high level), the scan enable signal SE may indicate the second operation mode.

For example, the first operation mode may refer to a normal mode in which a data transfer operation is performed, and the second operation mode may refer to a scan mode in which a scan operation (or a scan test operation) is performed. However, the present disclosure is not limited thereto, and in other embodiments, the first operation mode may be the scan mode, and the second operation mode may be the normal mode.

In the normal mode, the multi-bit flip-flop 10 may generate the first output signal Q0 and the second output signal Q1 by latching the first data input signal D0 and the second data input signal D1, respectively. The first data input signal D0 and second data input signals D1 may be received through two respective input pins, and the first output signal Q0 and the second output signal Q1 may be output through two respective output pins. Here, the first output signal Q0 may correspond to the first data input signal D0, and the second output signal Q1 may correspond to the second data input signal D1. According to one embodiment, the polarity of the first and second data input signals D0 and D1 may be identical to the polarity of the first and second data output signals Q0 and Q1. However, the present disclosure is not limited thereto, and the polarity of the first and second data input signals D0 and D1 may be different than the polarity of the first and second data output signals Q0 and Q1.

In the scan mode, the scan input signal SI may be received through one scan input pin P2, and the multi-bit flip-flop 10 may latch the scan input signal SI. In this case, a scan path passing through the flip-flops in the multi-bit flip-flop 10 may be formed. Here, an internal signal corresponding to the first output signal Q0 may be used as the next scan input signal. The signals occurring when the scan mode is performed may be output sequentially through a pin from which the second output signal Q1 is output.

Figure 2:
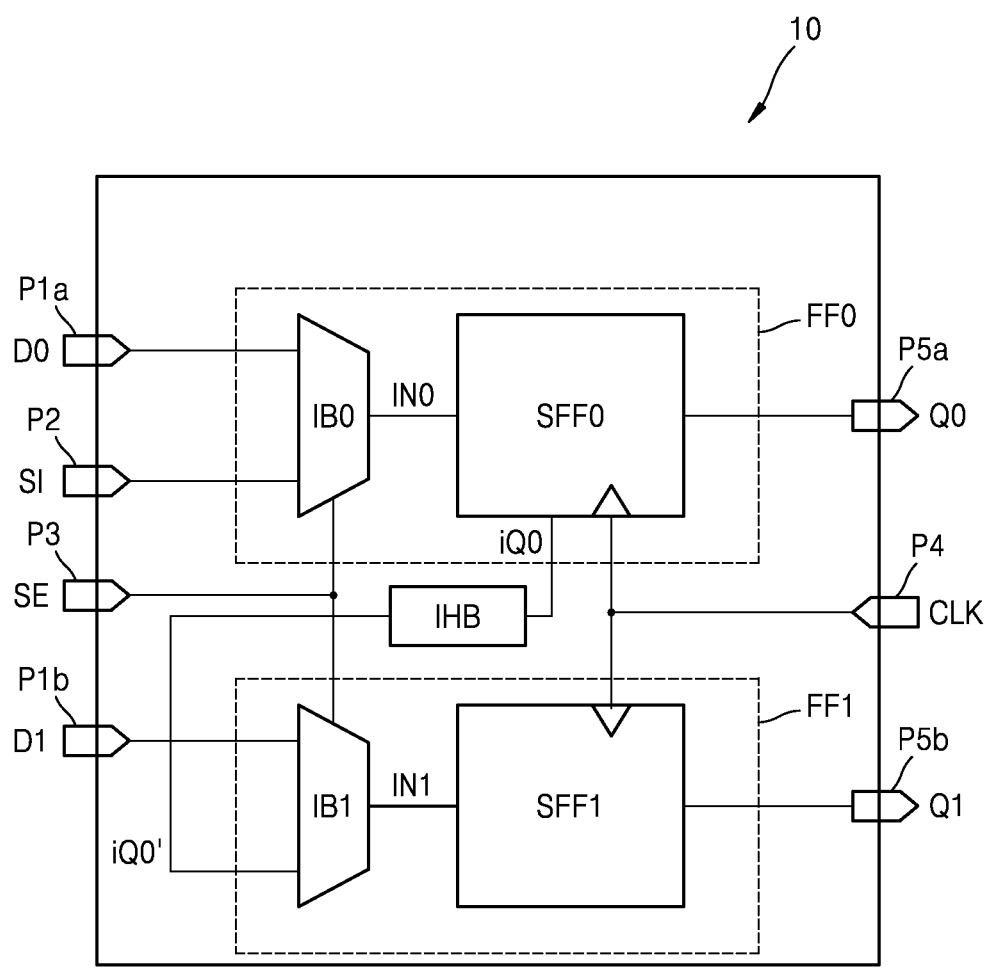
FIG. 2 is a block diagram of a multi-bit flip-flop according to an exemplary embodiment.

FIG. 2 illustrates a multi-bit flip-flop according to an exemplary embodiment.

With reference to FIG. 2, the multi-bit flip-flop 10 may include a first data input pin P1a, a second data input pin P1b, a scan input pin P2, a scan enable pin P3, a clock pin P4, a first output pin P5a, and a second output pin P5b. Here, a pin may be referred to as a conductor or a terminal.

Each of the first and second data input pins P1a and P1b may receive a data input signal. For example, the first data input pin P1a of the first and second data input pins P1a and P1b may receive the first data input signal D0, and the second data input pin P1b may receive the second data input signal D1.

The scan input pin P2 may receive the scan input signal SI, the scan enable pin P3 may receive the scan enable signal SE, and the clock pin P4 may receive the clock signal CLK.

Each of the first and second output pins P5a and P5b may output an output signal. For example, the first output pin P5a may output the first output signal Q0, and the second output pin P5b may output the second output signal Q1.

Although it is not shown in the drawings, the multi-bit flip-flop 10 may further include a reset pin (not shown) configured to receive a reset signal R.

As described above, as the multi-bit flip-flop 10 includes a single scan input pin P2, the degree of freedom in designing a circuit may increase, compared to the case where the multi-bit flip-flop 10 includes a plurality of scan input pins.

The multi-bit flip-flop 10 may include a first flip-flop FF0, a second flip-flop FF1, and an internal hold buffer IHB. In FIG. 2, the multi-bit flip-flop 10 includes two flip-flops, but the present disclosure is not limited thereto, and the multi-bit flip-flop 10 may include three or more flip-flops. Hereinafter, it will be assumed that the multi-bit flip-flop 10 includes two flip-flops.

The first flip-flop FF0 may be electrically connected to the first data input pin P1a, the scan input pin P2, the scan enable pin P3, the clock pin P4, and the first output pin P5a. The first flip-flop FF0 may include a first input block IB0 and a first internal flip-flop SFF0.

The first input block IB0 may receive the scan enable signal SE, the first data input signal D0, and the scan input signal SI. The first input block IB0 may select any one of the first data input signal D0 and the scan input signal SI according to the scan enable signal SE. The first input block IB0 may generate a first input signal IN0 corresponding to the selected signal.

The first internal flip-flop SFF0 may receive the first input signal IN0. The first internal flip-flop SFF0 may generate a first internal signal iQ0 by latching the first input signal IN0 according to the clock signal CLK. The first internal flip-flop SFF0 may output the first output signal Q0 corresponding to the first internal signal iQ0 to a first output pin P5a.

In one embodiment, the first internal signal iQ0 may correspond to a scan output of the first flip-flop FF0 in the scan mode. In this case, the first internal flip-flop SFF0 may output the first internal signal iQ0 to the internal hold buffer IHB. In one embodiment, the first internal signal iQ0 may have the same logic level with respect to the first output signal Q0. In one embodiment, the first internal signal iQ0 may have an inverted logic level with respect to the first output signal Q0.

The internal hold buffer IHB may output a scan output of the first flip-flop FF0 to the second flip-flop FF1 in the scan mode. For example, the internal hold buffer IHB may generate a second internal signal iQ0' by buffering the first internal signal 100 provided from the first internal flip-flop SFF0. The internal hold buffer IHB may output the second internal signal iQ0' to the second flip-flop FF1. The hold buffer and buffer in this specification may refer to a single inverter. When the internal hold buffer IHB is included in the multi-bit flip-flop 10, a hold margin may be secured, which may have the effect of preventing hold time violation.

In one embodiment, the second internal signal iQ0' may have the same logic level as the first output signal Q0. However, the present disclosure is not limited thereto, and the second internal signal iQ0' may have an inverted logic level with respect to the first output signal Q0.

The second flip-flop FF1 may be electrically connected to the second data input pin P1b, the scan enable pin P3, the clock pin P4, and the second output pin P5b. The second flip-flop FF1 may include a second input block IB1 and a second internal flip-flop SFF1.

The second input block IB1 may receive the scan enable signal SE, the second data input signal D1, and the second internal signal iQ0'. The second input block IB1 may select any one of the second data input signal D1 and the second internal signal iQ0' according to the scan enable signal SE. The second input block IB1 may generate a second input signal IN1 corresponding to the selected signal.

The second internal flip-flop SFF1 may receive the second input signal IN1. The second internal flip-flop SFF1 may generate a third internal signal (not shown) by latching the second input signal IN1 according to the clock signal CLK. The second internal flip-flop SFF1 may receive the second output signal Q1.

In one embodiment, when the scan enable signal SE indicates the normal mode, a first data path (not shown) and a second data path (not shown) may be generated in the multi-bit flip-flop 10. For example, when the scan enable signal SE has a first logic level, the first input block IB0 may select the first data input signal D0 received through the first data input pin P1a. The first internal flip-flop SFF0 may latch the first input signal IN0 corresponding to the first data input signal D0 and output the first output signal Q0 through the first output pin P5a.

The second input block IB1 may select the second data input signal D1 received through the second data input pin P1b. The second internal flip-flop SFF1 may latch the second input signal IN1 corresponding to the second data input signal D1 and output the second output signal Q1 through the second output pin P5b. In the normal mode, the first and second output signals Q0 and Q1 may have the same polarity as that of the first and second data input signals D0 and D1. However, the present disclosure is not limited thereto.

When the scan enable signal SE indicates the scan mode, one scan path (not shown) may be generated in the multi-bit flip-flop 10. For example, when the scan enable signal SE has a second logic level, the first input block IB0 may select the scan input signal SI received through the scan input pin P2. The first internal flip-flop SFF0 may latch the first input signal IN0 corresponding to the scan input signal SI and generate the first internal signal iQ0 and the first output signal Q0. The first internal flip-flop SFF0 may output the first internal signal iQ0 to the internal hold buffer IHB. The first internal flip-flop SFF0 may output the first output signal Q0 corresponding to the first internal signal iQ0 to the first output pin P5a. The internal hold buffer IHB may buffer the first internal signal iQ0 and output the second internal signal iQ0' to the second input block IB1.

The second input block IB1 may select the second internal signal iQ0' output from the internal hold buffer IHB. The second internal flip-flop SFF1 may latch the second input signal IN1 corresponding to the second internal signal iQ0' and output the second output signal Q1 through the second output pin P5b. In scan mode, the first and second output signals Q0 and Q1 may have the same polarity as that of the scan input signal SI. However, the present disclosure is not limited thereto.

As described above, as a scan path of the first flip-flop FF0 is connected to a scan path of the second flip-flop FF1, one scan path may be generated. In this manner, the multi-bit flip-flop 10 may operate substantially similarly to a scan chain including a plurality of flip-flops, each of which is implemented by a plurality of cells, and the cell area and power consumption may also be reduced.

Figure 3:
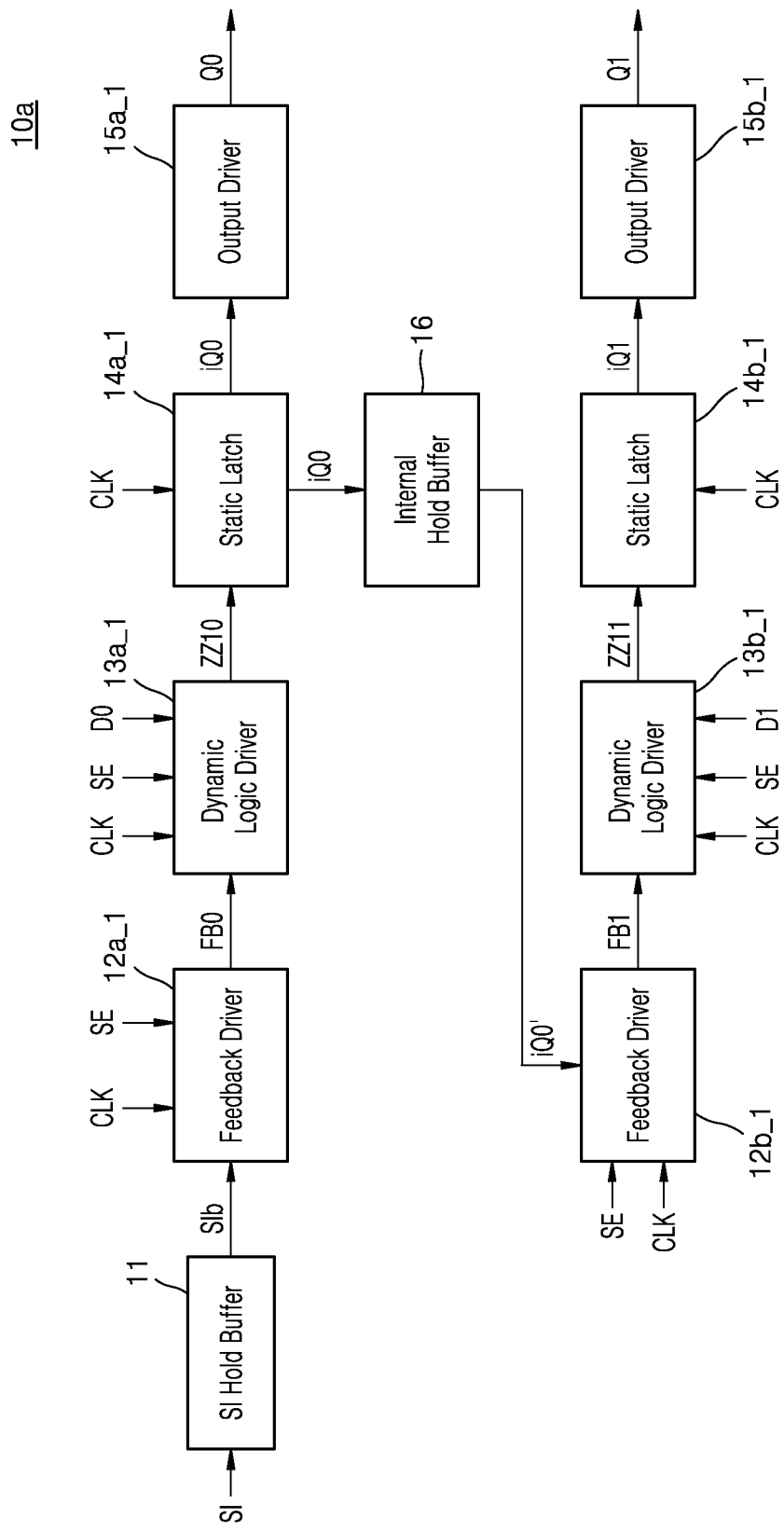
FIG. 3 is a block diagram of a plurality of flip-flops included in a multi-bit flip-flop according to an embodiment.

FIG. 3 illustrates a plurality of flip-flops included in a multi-bit flip-flop according to an embodiment. A multi-bit flip-flop 10a of FIG. 3 may be referred to as a semi-dynamic flip-flop.

With reference to FIGS. 2 and 3, the multi-bit flip-flop 10a may include a scan input hold buffer 11, the first flip-flop FF0, the second flip-flop FF1, and an internal hold buffer 16.

The scan input hold buffer 11 may be electrically connected with the scan input pin P2. The scan input hold buffer 11 may buffer the scan input signal SI, and output the buffered signal to a first feedback driver 12a_1. In one embodiment, the scan input hold buffer 11 may be implemented by an inverter. In this case, the buffered signal may be an inverted scan input signal SIb.

The first flip-flop FF0 may include the first feedback deriver 12a_1, a first dynamic logic driver 13a_1, a first static latch 14a_1, and a first output driver 15a_1. Here, the first input block IB0 of FIG. 2 may include parts of the first feedback driver 12a_1 and the first dynamic logic driver 13a_1.

The first feedback driver 12a_1 may generate a first feedback signal FB0 based on the inverted scan input signal SIb, the clock signal CLK, and the scan enable signal SE. The first feedback driver 12a_1 may output the first feedback signal FB0 to the first dynamic logic driver 13a_1.

The first dynamic logic driver 13a_1 may generate a first dynamic feedback signal ZZ10 based on the first feedback signal FB0, the clock signal CLK, the scan enable signal SE, and the first data input signal D0. The first driver logic driver 13a_1 may output the first dynamic feedback signal ZZ10 to the first static latch 14a_1.

The first static latch 14a_1 may generate the first internal signal iQ0 based on the clock signal CLK and the first dynamic feedback signal ZZ10. The first static latch 14a_1 may output the first internal signal iQ0 to the internal hold buffer 16 and the first output driver 15a_1.

The first output driver 15a_1 may output the first output signal Q0 corresponding to the first internal signal iQ0.

The internal hold buffer 16 may generate the second internal signal iQ0' by buffering the first internal signal iQ0. In one embodiment, the internal hold buffer 16 may be implemented by a single inverter. In this case, the second internal signal iQ0' may have an inverted logic level with respect to the first internal signal iQ0. However, the present disclosure is not limited thereto, and in an alternate embodiment, when the internal hold buffer 16 is implemented by two inverters, the second internal signal iQ0' may have the same logic level with respect to the first internal signal iQ0, for example.

The second flip-flop FF1 may include a second feedback driver 12b_1, a second dynamic logic driver 13b_1, a second static latch 14b_1, and a second output driver 15b_1. Here, the second input block 1131 of FIG. 2 may include parts of the second feedback driver 12b_1 and the second dynamic logic driver 13b_1.

The second feedback driver 12b_1 may generate a second feedback signal FB1 based on the second internal signal iQ0', the clock signal CLK, and the scan enable signal SE. The second feedback driver 12b_1 may output the second feedback signal FB1 to the second dynamic logic driver 13b_1.

The second dynamic logic driver 13b_1 may generate a second dynamic feedback signal ZZ11 based on the second feedback signal FB1, the clock signal CLK, the scan enable signal SE, and the second data input signal D1. The second dynamic logic driver 13b_1 may output the second dynamic feedback signal ZZ11 to the second static latch 14b_1.

The second static latch 14b_1 may generate a third internal signal iQ1 based on the clock signal CLK and the second dynamic feedback signal ZZ11. The second static latch 14b_1 may output the third internal signal iQ1 to the second output driver 15b_1.

The second output driver 15b_1 may output the second output signal Q1 corresponding to the third internal signal iQ1.

FIGS. 4A to 4D illustrate layout examples of a multi-bit flip-flop of FIG. 3 implemented as a cell.

Figure 4A:
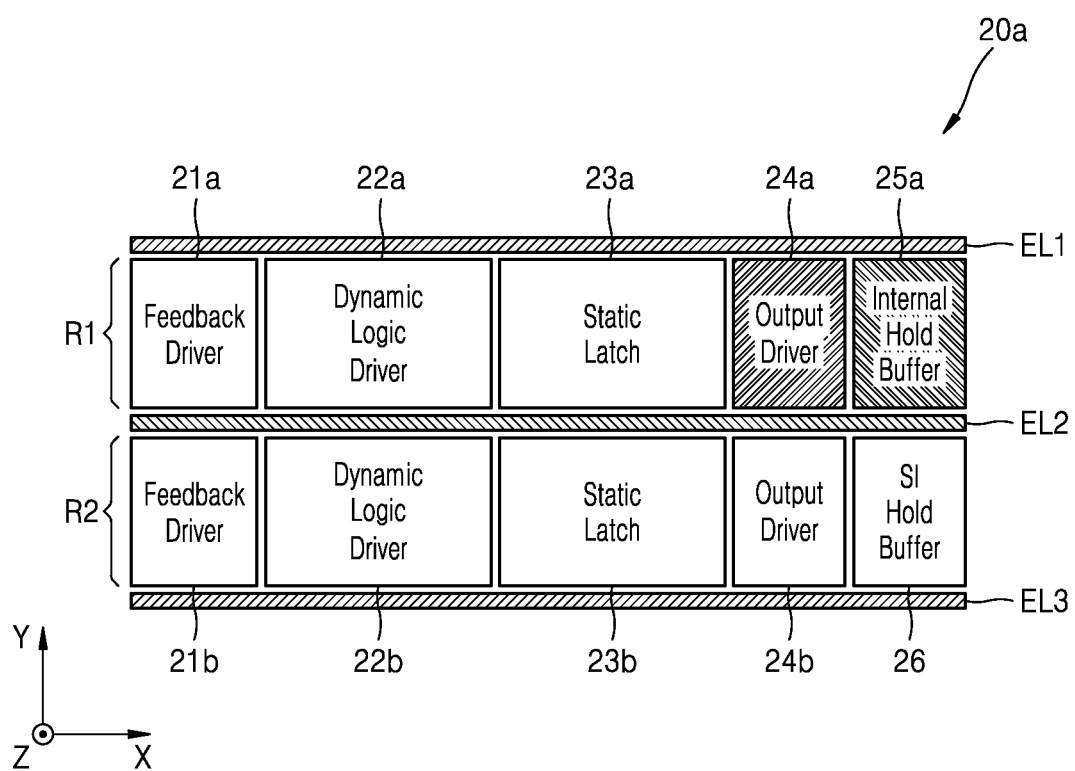
FIGS. 4A to 4D are layout diagrams of a multi-bit flip-flop of FIG. 3 implemented as a cell.

With reference to FIG. 4A, a multi-bit flip-flop 20a of FIG. 4A may include a first power rail EL1, a second power rail EL2, a third power rail EL3, which extend in the x-axis direction, a first feedback driver 21a, a second feedback driver 21b, a first dynamic logic driver 22a, a second dynamic logic driver 22b, a first static latch 23a, a second static latch 23b, a first output driver 24a, a second output driver 24b, an internal hold buffer 25a, and a scan input hold buffer 26. The first to third power rails EL1, EL2, and EL3 may be conducting wires where power is supplied. For example, the first power rail EL1 and the third power rail EL3 may be conducting wires where a positive supply voltage is supplied, and the second power rail EL2 may be a conducting wire where a negative supply voltage or a ground potential is supplied. However, the present disclosure is not limited thereto. Each of the components included in the multi-bit flip-flop 20a may be implemented by a single cell.

In one embodiment, the first feedback driver 21a, the first dynamic logic driver 22a, the first static latch 23a, and the first output driver 24a included in the first flip-flop (e.g., FF0 of FIG. 2) may be arranged adjacent to each other on the first row R1. Here, the first row R1 may extend in the x-axis direction, but the present disclosure is not limited thereto. The first feedback driver 21a, the first dynamic logic driver 22a, the first static latch 23a, and the first output driver 24a may be arranged in this stated order in a +x direction on the first row R1.

In one embodiment, the internal hold buffer 25a may be arranged adjacent to the first output driver 24a on the first row R1. With reference to FIGS. 2 and 4A, for example, the internal hold buffer 25a may be arranged adjacent to the first flip-flop FF0, and the first output pin P5a.

In one embodiment, the second feedback driver 21b, the second dynamic logic driver 22b, the second static latch 23b, and the second output driver 24b included in the second flip-flop (e.g., FF1 of FIG. 2) may be arranged adjacent to each other on a second row R2. Here, the second row R2 may be a row adjacent to the first row R1. The second feedback driver 21b, the second dynamic logic driver 22b, the second static latch 23b, and the second output driver 24b may be arranged in this stated order on the second row R2.

The scan input hold buffer 26 may be arranged adjacent to the second output driver 24b.

Figure 4B:
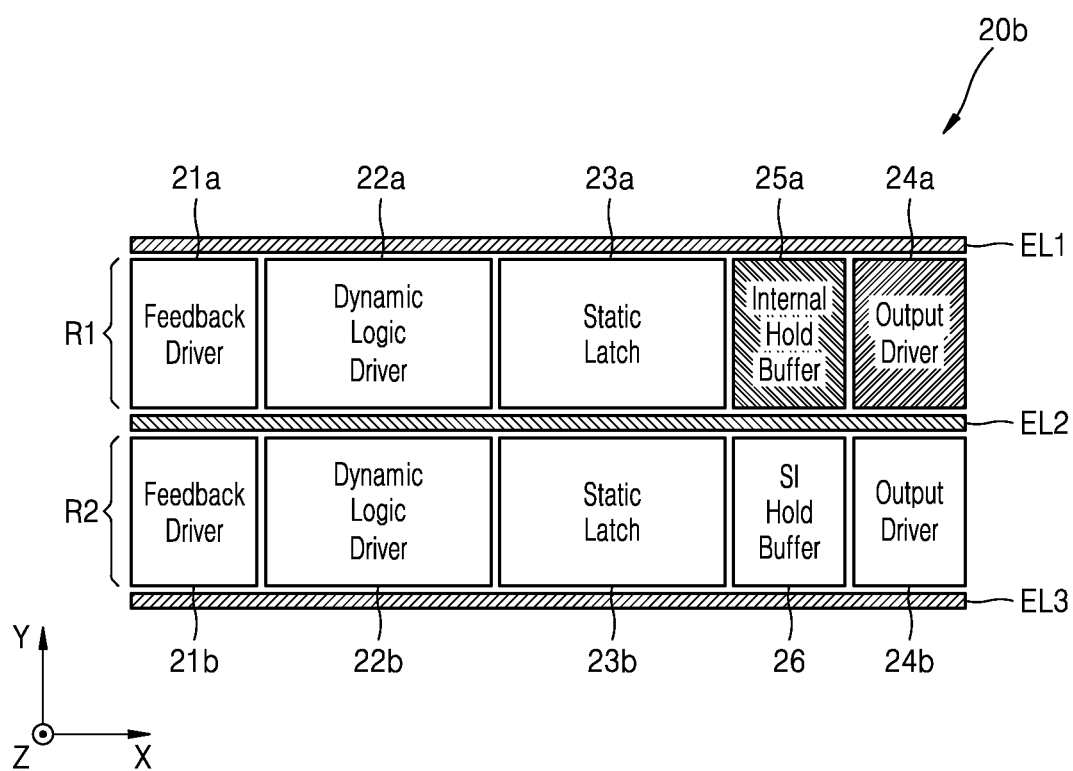

With reference to FIG. 4B, a multi-bit flip-flop 20b of FIG. 4B may include the first power rail EL1, the second power rail EL2, the third power rail EL3, the first feedback driver 21a, the second feedback driver 21b, the first dynamic logic driver 22a, the second dynamic logic driver 22b, the first static latch 23a, the second static latch 23b, the first output driver 24a, the second output driver 24b, the internal hold buffer 25a, and the scan input hold buffer 26, as described with reference to FIG. 4A. The first static latch 23a, the internal hold buffer 25a, and the first output driver 24a may be arranged in this stated order in the +x direction on the first row R1. The scan input hold buffer 26 may be arranged adjacent to the second output driver 24b. With reference to FIG. 4B, for example, the second static latch 23b, the scan input hold buffer 26, and the second output deriver 24b may be arranged in this stated order on the second row R2. However, the present disclosure is not limited thereto.

Figure 4C:
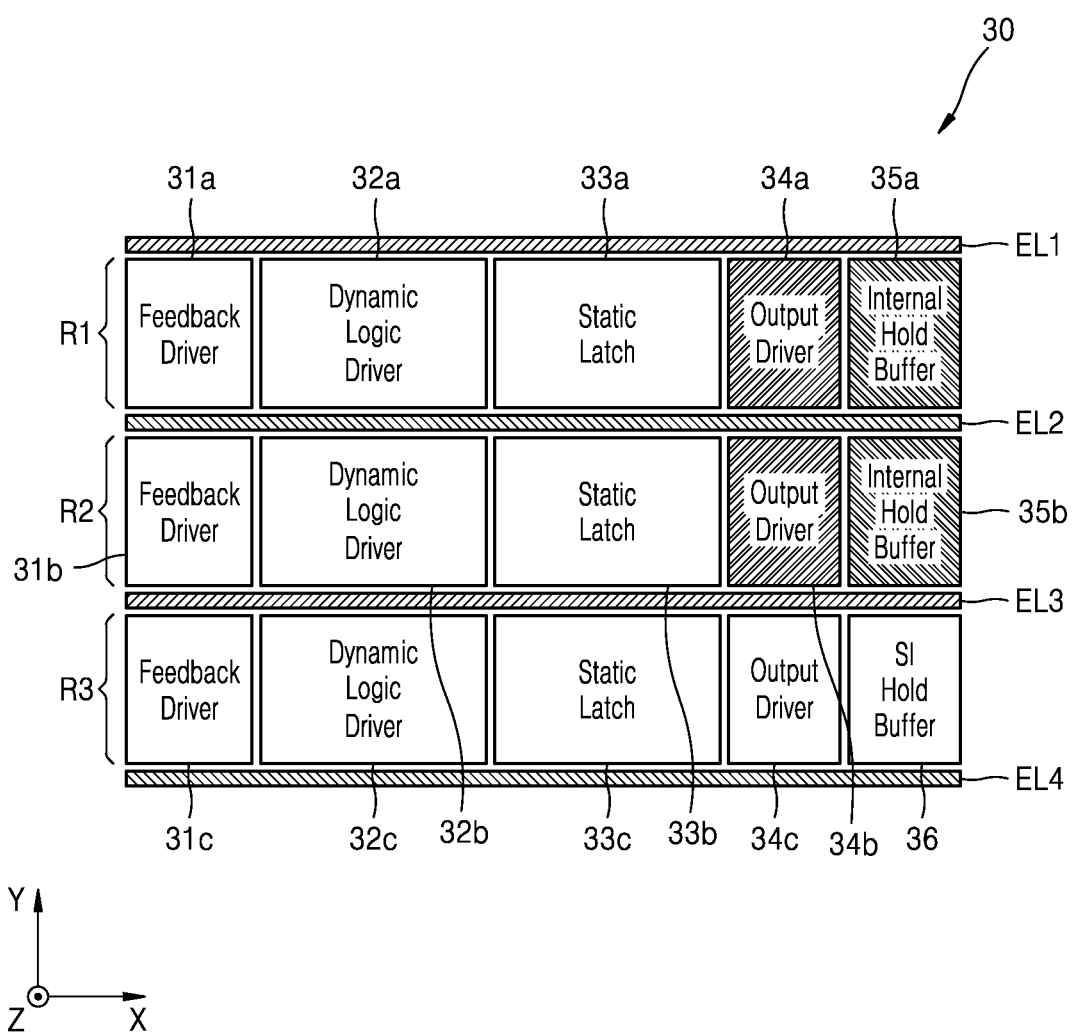

With reference to FIG. 4C, a multi-bit flip-flop 30 of FIG. 4C may be a 3-bit flip-flop including three flip-flops. The multi-bit flip-flop 30 of FIG. 4C may include a first power rail EL1, a second power rail EL2, a third power rail EL3, a fourth power rail EL4, a first feedback driver 31a, a second feedback driver 31b, a third feedback driver 31c, a first dynamic logic driver 32a, a second dynamic logic driver 32b, a third dynamic logic driver 33c, a first static latch 33a, a second static latch 33b, a third static latch 33c, a first output driver 34a, a second output driver 34b, a third output driver 34c, a first internal hold buffer 35a, a second internal hold buffer 35b, and a scan input hold buffer 36.

In one embodiment, the first power rail EL1 and the third power rail EL3 may be conducting wires where a positive supply voltage is supplied, and the second power rail EL2 and the fourth power rail EL4 may be conducting wires where a negative supply voltage or a ground potential is supplied. However, the present disclosure is not limited thereto.

In the multi-bit flip-flop 30 of FIG. 4C, the first feedback driver 31a, the first dynamic logic driver 32a, the first static latch 33a, and the first output driver 34a included in the first flip-flop may be arranged in this stated order on the first row R1. The second feedback driver 31b, the second dynamic logic driver 32b, the second static latch 33b, and the second output driver 34b included in the second flip-flop may be arranged in this stated order on the second row R2. The third feedback driver 31c, the third dynamic logic driver 32c, the third static latch 33c, and the third output driver 34c included in the third flip-flop may be arranged in this stated order on a third row R3.

In one embodiment, the first internal hold buffer 35a may be arranged adjacent to the first output driver 34a on the first row R1, and the second internal hold buffer 35b may be arranged adjacent to the second output driver 34b on the second row R2.

The scan input hold buffer 36 may be arranged adjacent to the third output driver 34c.

Figure 4D:
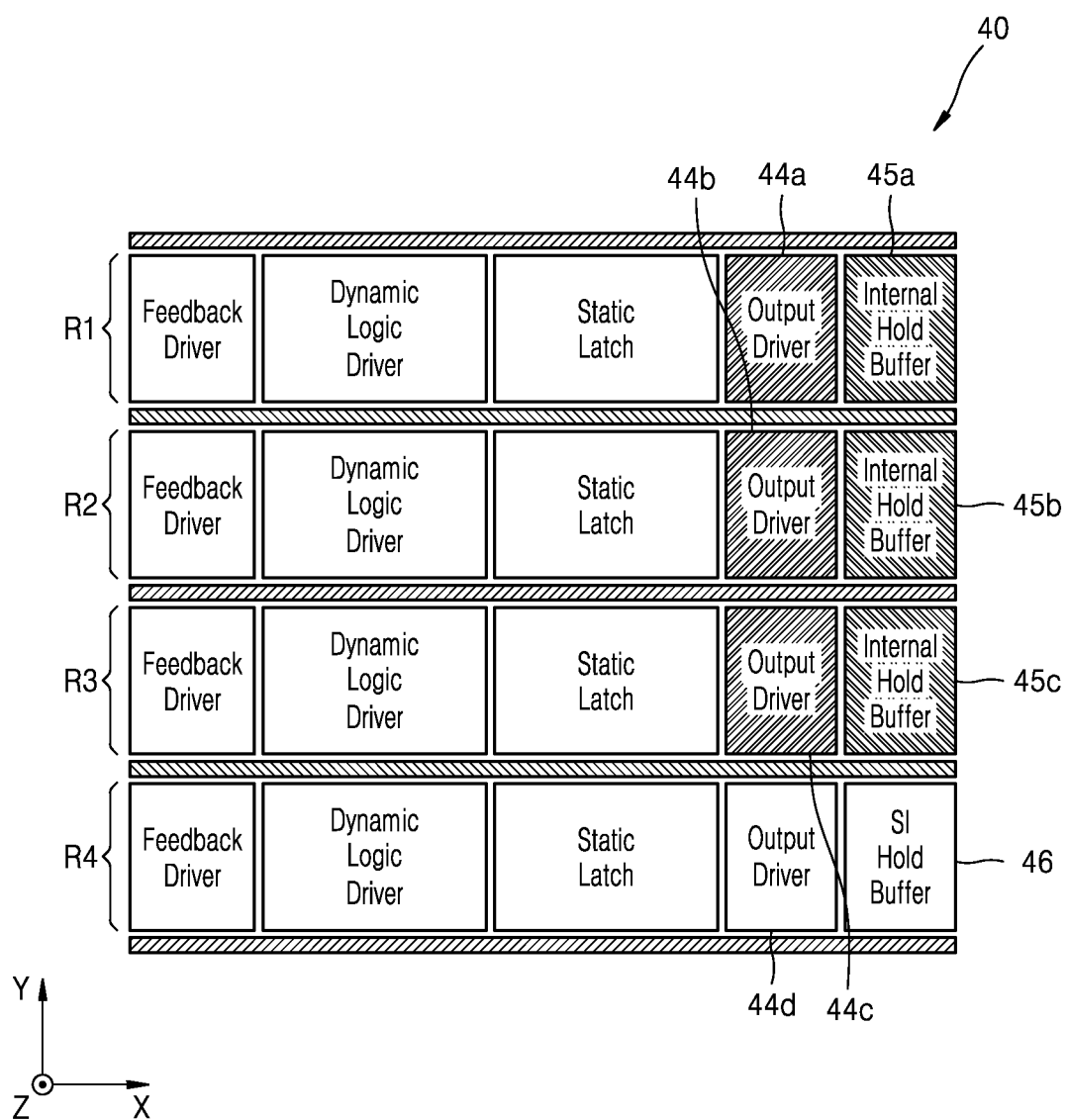

The embodiment described above may be applied to a 4-bit flip-flop 40 of FIG. 4D. For example, a first output driver 44a and a first internal hold buffer 45a may be arranged adjacent to each other on the first row R1, a second output driver 44b and a second internal hold buffer 45b may be arranged adjacent to each other on the second row R2, and a third output driver 44c and a third internal hold buffer 45c may be arranged adjacent to each other on the third row R3. A fourth output driver 44d and a scan input hold buffer 46 may be arranged on a fourth row R4.

The embodiment described above may be applied to a flip-flop of five or more bits.

FIGS. 5A to 5D illustrate a multi-bit flip-flop according to an embodiment.

Figure 5A:
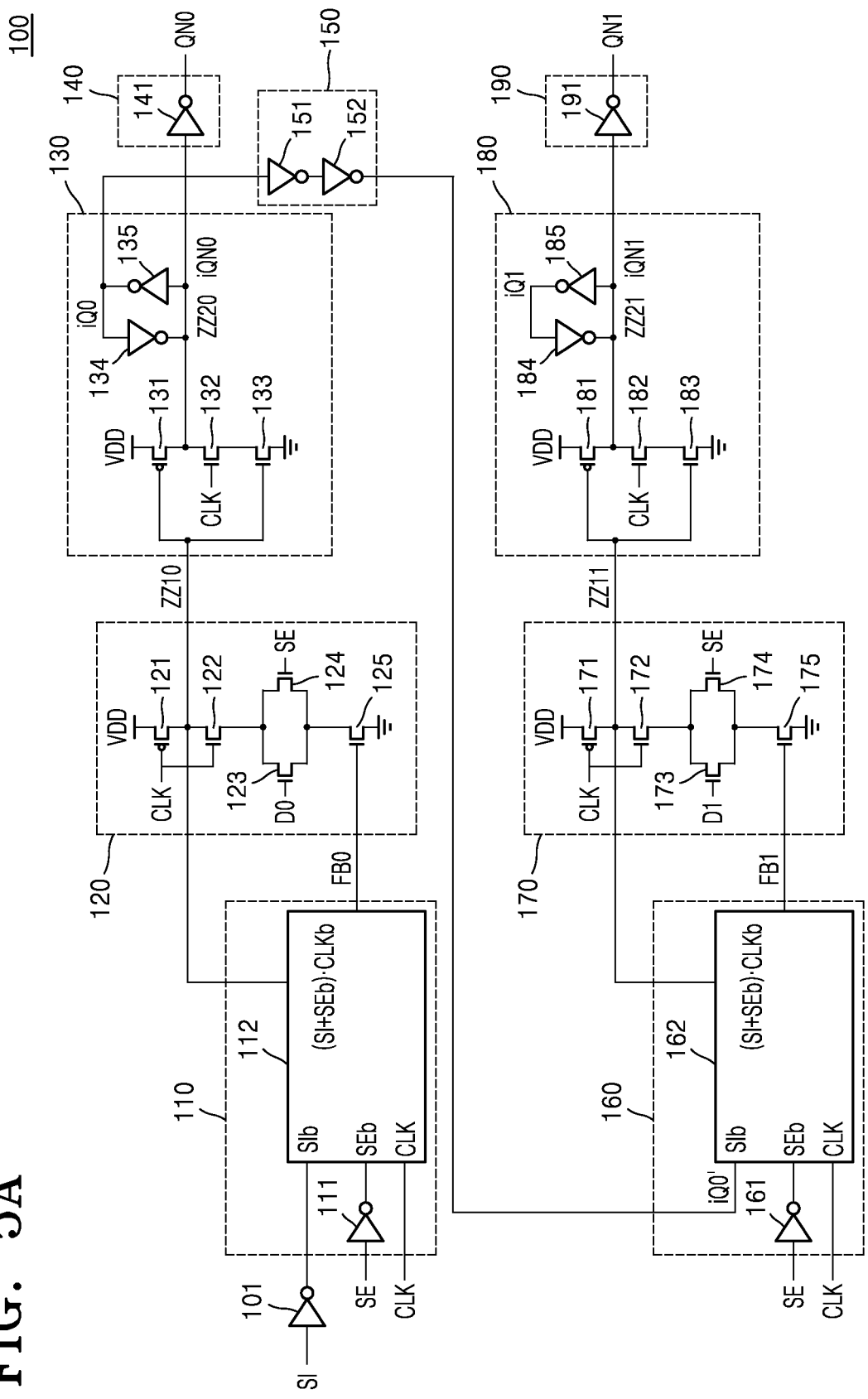
FIGS. 5A to 5D are circuit diagrams of a multi-bit flip-flop according to an embodiment.

With reference to FIG. 5A, a multi-bit flip-flop 100 may include a scan input hold buffer 101, a first feedback driver circuit 110, a second feedback driver circuit 160, a first dynamic logic driver circuit 120, a second dynamic logic driver circuit 170, a first static latch circuit 130, a second static latch circuit 180, a first output driver circuit 140, a second output driver circuit 190, and an internal hold buffer 150.

The scan input hold buffer 101 may buffer the scan input signal SI, and output the buffered signal to the first feedback driver circuit 110. For example, the scan input hold buffer 101 may be implemented by an inverter. In this case, the scan input hold buffer 101 may buffer the scan input signal SI, and output the inverted scan input signal SIb to the first feedback driver circuit 110.

In one embodiment, the first flip-flop may include the first feedback driver circuit 110, the first dynamic logic driver circuit 120, the first static latch circuit 130, and the first output driver circuit 140.

The first feedback driver circuit 110 may correspond to the first feedback driver 12a_1 of FIG. 3. The first feedback driver circuit 110 may generate the first feedback signal FB0 based on the clock signal CLK, the scan input signal SI, the scan enable signal SE, and the first dynamic feedback signal ZZ10. For example, the first feedback driver circuit 110 may receive the inverted scan input signal SIb, the inverted scan enable signal SEb, the clock signal CLK, and the first dynamic feedback signal ZZ10, perform logical operations on the scan input signal SI, the inverted scan enable signal SEb, and an inverted clock signal CLKb, and output the first feedback signal FB0 corresponding to results of the logical operations to the first dynamic logic driver circuit 120. Here, the logical operations may be AND operations involving logical OR of the scan input signal SI and the inverted scan enable signal SEb, and the inverted clock signal CLKb. The first feedback driver circuit 110 may include a first input inverter 111 and a first operational circuit 112.

The first dynamic logic driver circuit 120 may correspond to the first dynamic logic driver 13a_1 of FIG. 3. The first dynamic logic driver circuit 120 may generate the first input signal based on the clock signal CLK, the first feedback signal FB0, the first data input signal D0, and the scan enable signal SE, and generate the first dynamic feedback signal ZZ10 corresponding to the first input signal. The first dynamic logic driver circuit 120 may include a first transistor 121, a second transistor 122, a third transistor 123, a fourth transistor 124, and a fifth transistor 125. The first transistor 121 may include a gate electrode receiving the clock signal CLK, a first electrode receiving a positive supply voltage VDD, and a second electrode electrically connected to a line where the first feedback signal FB0 flows. The second transistor 122 may include a gate electrode receiving the clock signal CLK, and a first electrode and a second electrode, which are electrically connected with the second electrode of the first transistor 121. The third transistor 123 may include a gate electrode receiving the first data input signal D1, and a first electrode and a second electrode, which are electrically connected with the second electrode of the transistor 122. The fourth transistor 124 may include a gate electrode receiving the scan enable signal SE and electrodes connected with the first electrode and the second electrode of the third transistor 123, respectively. The fifth transistor 125 may include a gate electrode receiving the first feedback signal FB0, a first electrode electrically connected with the second electrode of the third transistor 123 and the second electrode of the fourth transistor 124, and a second electrode receiving a negative supply voltage or a ground potential. Here, a level of the negative supply voltage or the ground potential may be lower than a level of the positive supply voltage VDD, and for example, the negative supply voltage or the ground potential may be a ground voltage. However, the present disclosure is not limited thereto.

The first static latch circuit 130 may correspond to the first static latch 14a_1 of FIG. 3. The first static latch circuit 130 may generate a first latch feedback signal ZZ20 and the first internal signal iQ0 based on the first dynamic feedback signal ZZ10. The first static latch circuit 130 may include a first transistor 131, a second transistor 132, a third transistor 133, a first inverter 134, and a second inverter 135. The first transistor 131 may include a gate electrode receiving the first dynamic feedback signal ZZ10, and a first electrode, and a second electrode, which receive the positive supply voltage VDD. The second transistor 132 may include a gate electrode receiving the clock signal CLK, and a first electrode, and a second electrode, which are electrically connected with the second electrode of the first transistor 131. The third transistor 133 may include a gate electrode receiving the first dynamic feedback signal ZZ10, a first electrode electrically connected with the second electrode of the second transistor 132, and a second electrode receiving a negative supply voltage or a ground potential. The first inverter 134 may include an input terminal electrically connected with an output terminal of the second inverter 135, and an output terminal electrically connected with an input terminal of the second inverter 135.

The first output driver circuit 140 may correspond to the first output driver 15a_1 of FIG. 3. The first output driver circuit 140 may include a first output inverter 141. The first output inverter 141 may receive a first internal inversion signal iQN0 and output a first output signal QN0 by inverting a first latch feedback signal ZZ20. Here, the first output signal QN0 may have an inverted logic level with respect to the first data input signal D0.

The internal hold buffer 150 may receive the first internal signal iQ0, and generate the second internal signal iQ0' by buffering the received first internal signal iQ0. In one embodiment, the internal hold buffer 150 may be implemented by two inverters, for example, first and second inverters 151 and 152, connected in series. The first inverter 151 may include an input terminal electrically connected between an output terminal of the first static latch circuit 130 and an input terminal of the first output driver circuit 140. The second inverter 152 may include an output terminal connected with the first inverter 151 in series and electrically connected with an input terminal of the second feedback driver circuit 160 (e.g., a terminal to which the inverted scan input signal SIb is input in the second operational circuit 162.) However, the present disclosure is not limited thereto.

The second internal signal iQ0' may be used as a scan input signal input to the second feedback driver circuit 160. Accordingly, the scan path of the first flip-flop and the scan path of the second flip-flop may be connected to each other.

In one embodiment, the second flip-flop may include the second feedback driver circuit 160, the second dynamic logic driver circuit 170, the second static latch circuit 180, and the second output driver circuit 190, which may correspond to the second feedback driver 12b_1, the second dynamic logic driver 13b_1, the second static latch 14b_1, and the second output driver 15b_1 of FIG. 3, respectively.

The second feedback driver circuit 160 may generate a second feedback signal FB1 based on the clock signal CLK, the second internal signal iQ0', the scan enable signal SE, and the second dynamic feedback signal ZZ11. The second feedback driver circuit 160 may include a second input inverter 161 and the second operational circuit 162.

The second dynamic logic driver circuit 170 may generate a second input signal based on the clock signal CLK, the second feedback signal FB1, the second data input signal D1, and the scan enable signal SE, and generate the second dynamic feedback signal ZZ11 corresponding to the second input signal. The second dynamic logic driver circuit 170 may include first to fifth transistors 171 to 175.

The second static latch circuit 180 may generate a second latch feedback signal ZZ21 and the third internal signal iQ1 based on the second dynamic feedback signal ZZ11. The second static latch circuit 180 may include a first transistor 181, a second transistor 182, a third transistor 183, a first inverter 184, and a second inverter 185.

The second output driver circuit 190 may generate a second output signal QN1 based on the second latch feedback signal ZZ21. The second output driver circuit 190 may include a second output inverter 191 that may receive a second internal inversion signal iQN1 and output the second output signal QN1 by inverting the second latch feedback signal ZZ21. Here, the second output signal QN1 may have an inverted logic level with respect to the second data input signal D1.

A first data path may correspond to a path in which the first feedback signal FB0, the first dynamic feedback signal ZZ10, the first latch feedback signal ZZ20, and the first output signal QN0 are generated in this stated order. A second data path may correspond to a path in which the second feedback signal FB1, the second dynamic feedback signal ZZ11, the second latch feedback signal ZZ21, and the second output signal QN1 are generated in this stated order. The data path may be affected by the capacitance of lines where each signal flows. When the capacitance decreases, a data transfer speed may increase.

Figure 5B:
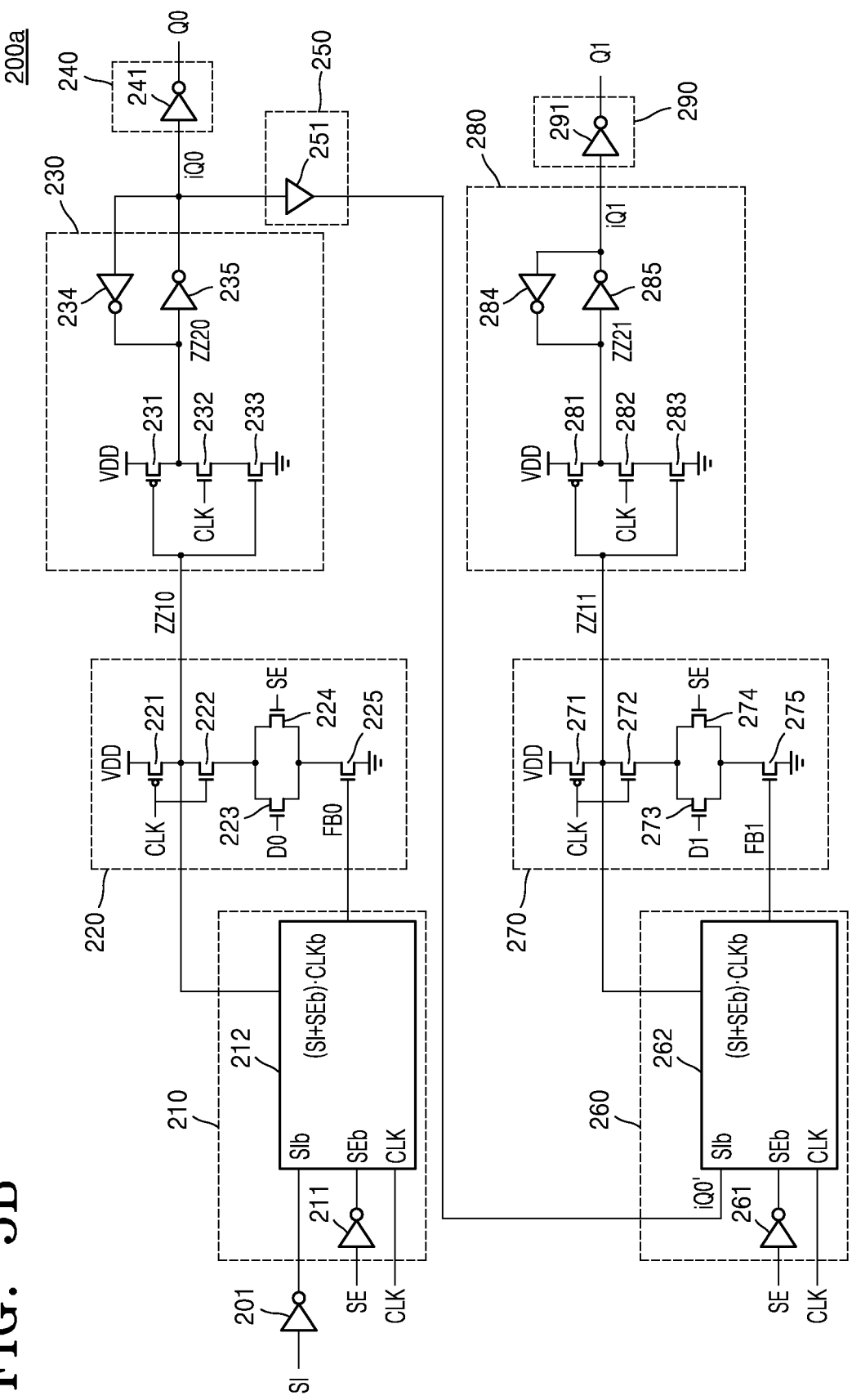

With reference to FIG. 5B, a multi-bit flip-flop 200*a* may include a scan input hold buffer 201, a first feedback driver circuit 210, a second feedback driver circuit 260, a first dynamic logic driver circuit 220, a second dynamic logic driver circuit 270, a first static latch circuit 230, a second static latch circuit 280, a first output driver circuit 240, a second output driver circuit 290, and an internal hold buffer 250, similarly to the multi-bit flip-flop of FIG. 5A.

The scan input hold buffer 201 the first feedback driver circuit 210, the second feedback driver circuit 260, the first dynamic logic driver circuit 220, and the second dynamic logic deriver circuit 270 are as described with reference to FIG. 5A, and thus, descriptions thereon are omitted.

The first static latch circuit 230 may generate the first internal signal iQ0 based on the first dynamic feedback signal ZZ10. The first static latch circuit 230 may include a first transistor 231, a second transistor 232, a third transistor 233, a first inverter 234, and a second inverter 235. The first inverter 234 may output the first latch feedback signal ZZ20 by inverting the first internal signal iQ0 output from the second inverter 235. The second inverter 235 may output the first internal signal iQ0 to the first inverter 234, the first output driver circuit 240, and the internal hold buffer 250 by inverting the first latch feedback signal ZZ20.

The first output driver circuit 240 may receive the first internal signal iQ0 and generate the first output signal Q0 by inverting the first internal signal iQ0. For example, the first output driver circuit 240 may include a first output inverter 242. Here, the first output signal Q0 may have the same logic level with respect to the first data input signal D0.

The internal hold buffer 250 may receive the first internal signal iQ0, and generate the second internal signal iQ0' by buffering the received first internal signal iQ0. The internal hold buffer 250 may include a buffer circuit 251. The buffer circuit 251 may include an input terminal and an output terminal. The input terminal may be electrically connected with an output terminal of the second inverter 235 and an input terminal of the first output driver circuit 240. The output terminal may be electrically connected with an input terminal receiving the scan input signal in the second feedback driver circuit 260. In one embodiment, the internal hold buffer 250 may be implemented by two inverters connected in series, but the present disclosure is not limited thereto.

The second static latch circuit 280 may generate a third internal signal iQ1 based on the second dynamic feedback signal ZZ11. The second static latch circuit 280 may include a first transistor 281, a second transistor 282, a third transistor 283, a first inverter 284, and a second inverter 285.

The second output driver circuit 290 may generate a signal corresponding to the third internal signal iQ1 as a second output signal Q1. Here, the second output signal Q1 may have the same logic level with respect to the second data input signal D1.

The first data path and the second data path may correspond to a path in which the feedback signal, the dynamic feedback signal, the latch feedback signal, and the output signal are generated in this stated order, as described above with reference to FIG. 5A. However, as each of the second inverters 235 and 285 is arranged on a data path line, the capacitance according to the embodiment of FIG. 5B may be greater than the capacitance according to the embodiment of FIG. 5A in an actual design. To minimize a decrease of the data transfer speed due to increased capacitance, the first output driver circuit 240 and the internal hold buffer 250 according to an embodiment may be arranged adjacent to each other.

Figure 5C:
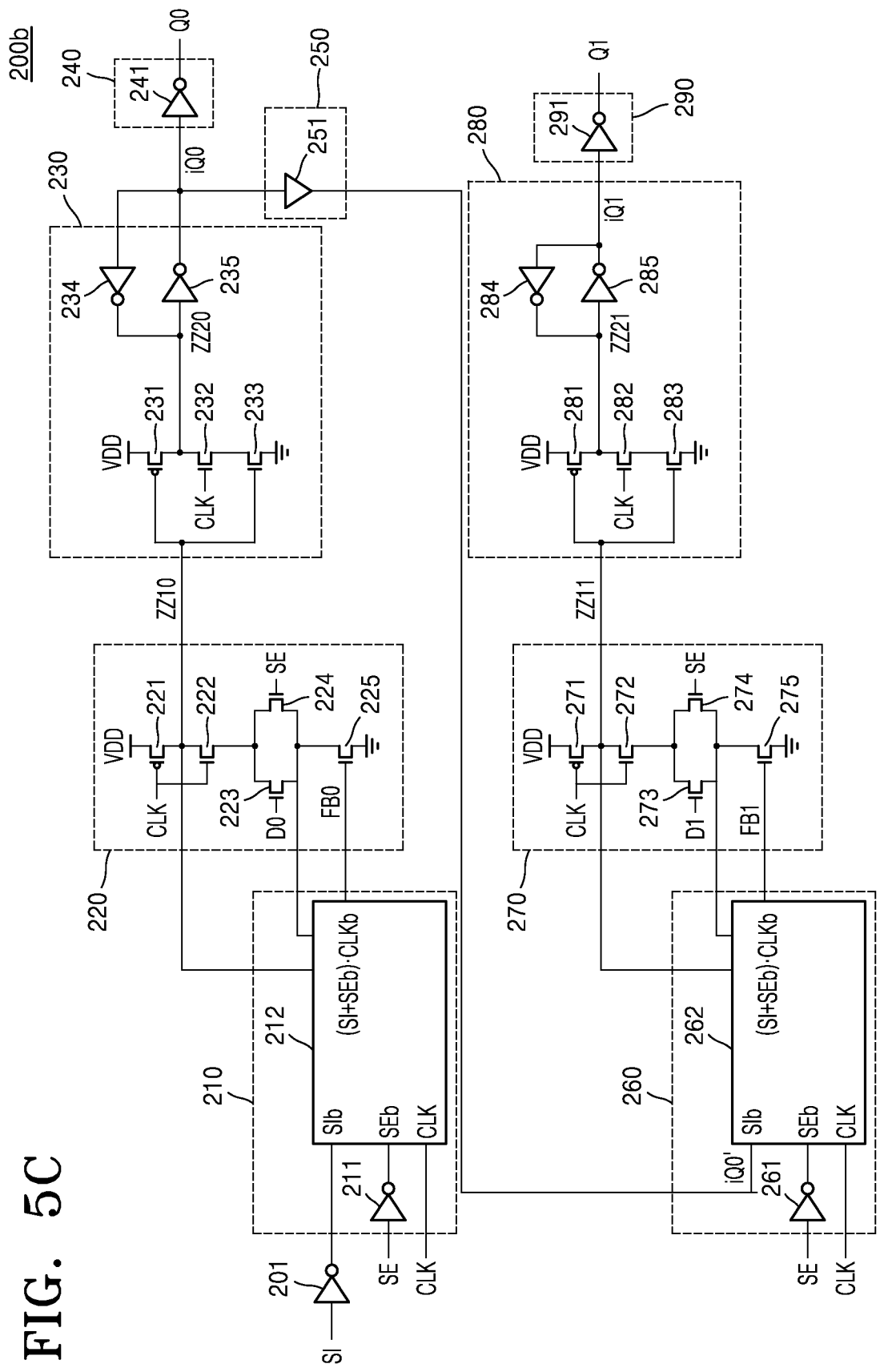

With respect to FIG. 5C, the first feedback driver circuit 210 may further use a voltage of a node where a second electrode (or a source electrode) of the third transistor 223 and a second electrode (or a source electrode) of the fourth transistor 224 are electrically connected to generate the first feedback signal FB0. The voltage of the node where the second electrode of the third transistor 223 and the second electrode of the fourth transistor 224 are electrically connected may be used as an input of the first feedback driver circuit 210. The node where the second electrode of the third transistor 223 and the second electrode of the fourth transistor 224 are electrically connected may have an inverted logic level with respect to a logic level of the first data input signal D0. The second feedback driver circuit 260 may further use a voltage of a node where second electrodes (or sources electrodes) of the third and fourth transistors 273 and 274 are electrically connected to generate the second feedback signal FB1 and the second dynamic feedback signal ZZ11. The voltage of the node where the second electrodes (or sources electrodes) of the third and fourth transistors 273 and 274 are electrically connected may be used as an input of the second feedback driver circuit 260. The node where the second electrodes (or sources electrodes) of the third and fourth transistors 273 and 274 are electrically connected may have an inverted logic level with respect to a logic level of the second data input signal D1. The multi-bit flip-flop 200*b* is identical to the multi-bit flip-flop 200*a* of FIG. 5B, and thus, descriptions thereon are omitted.

Figure 5D:
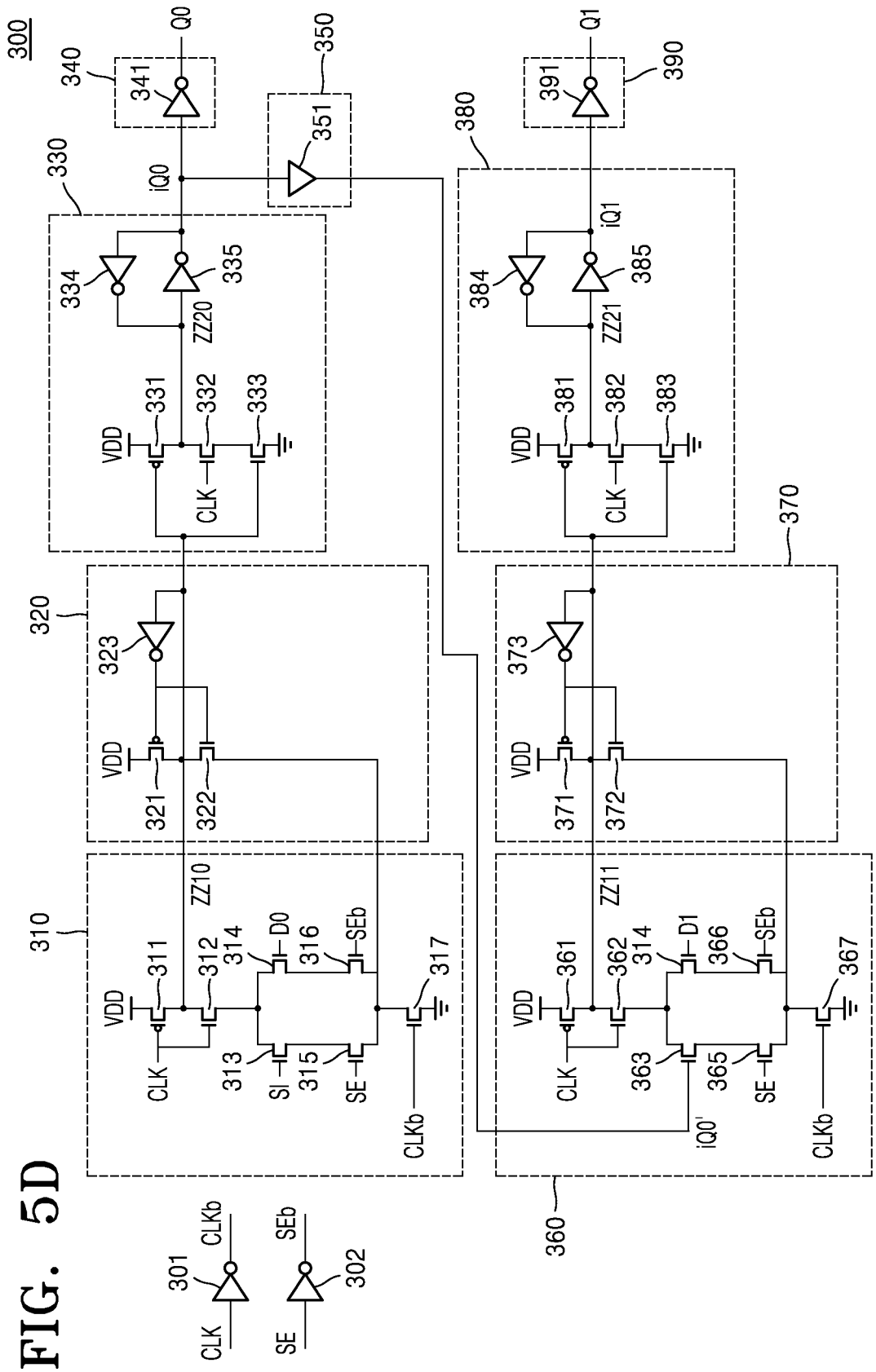

With reference to FIG. 5D, a multi-bit flip-flop 300 may include a clock buffer 301, a scan enable hold buffer 302, a first feedback driver circuit 310, a second feedback driver circuit 360, a first dynamic logic driver circuit 320, a second dynamic logic driver circuit 370, a first static latch circuit 330, a second static latch circuit 380, a first output driver circuit 340, a second output driver circuit 390, and an internal hold buffer 350.

The clock buffer 301 may receive the clock signal CLK and output the inverted clock signal CLKb to the first feedback driver circuit 310 and the second feedback driver circuit 360 by buffering the received clock signal CLK.

The scan enable hold buffer 302 may buffer the received scan enable signal SE, and output the inverted scan enable signal SEb to the first feedback driver circuit 310 and the second feedback driver circuit 360.

As for the first feedback driver circuit 310, as a first transistor 311 and a second transistor 312 are identical to the first and second transistors 121 and 122 described above with reference to FIG. 5A, respectively, descriptions thereon are omitted. A third transistor 313 may include a gate electrode receiving the scan input signal SI, and a first electrode, and a second electrode which are electrically connected to the second electrode of the second transistor 312. A fourth transistor 314 may include a gate electrode receiving the first data input signal D0, and a first electrode, and a second electrode which are electrically connected to the second electrode of the second transistor 312. A fifth transistor 315 may include a gate electrode receiving the scan enable signal SE, and a first electrode, and a second electrode, which are electrically connected with the second electrode of the third transistor 313. A sixth transistor 316 may include a gate electrode receiving the inverted scan enable signal SEb, and a first electrode, and a second electrode, which are electrically connected with the second electrode of the fourth transistor 314. A seventh transistor 317 may include a gate electrode receiving the inverted clock signal CLKb, a first electrode electrically connected with the second electrode of the fifth transistor 315 and the second electrode of the sixth transistor 316, and a second electrode connected with the ground voltage.

As for the first dynamic logic driver circuit 320, the gate electrode of the first transistor 321 and the gate electrode of the second transistor 322 may be electrically connected to an output of the inverter 323. The first electrode of the first transistor 321 may be electrically connected with the positive supply voltage VDD. The second electrode of the first transistor 321 may be electrically connected with the first electrode of the second transistor 322. The second electrode of the second transistor 322 may be electrically connected with the second electrode of the fifth transistor 315 and the second electrode of the sixth transistor 316. The input terminal of the inverter 323 may be electrically connected with the second electrode of the first transistor 321 and the first electrode of the second transistor 322.

The first static latch circuit 330, the second static latch circuit 380, the first output driver circuit 340, the second output driver circuit 390, and the internal hold buffer 350 are as described above, and thus, descriptions thereon are omitted.

Figure 6:
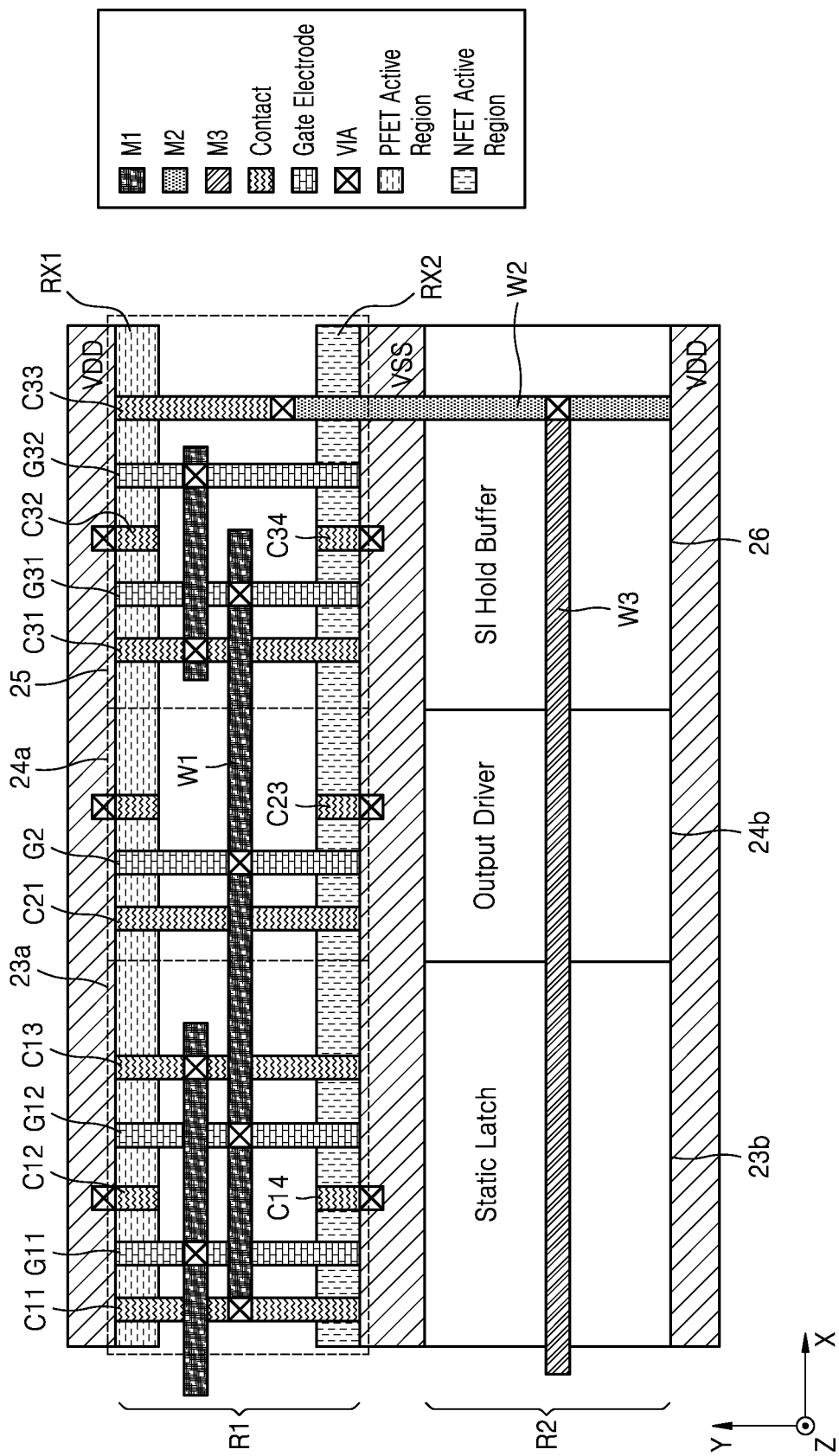
FIG. 6 is a layout diagram illustrating a multi-bit flip-flop according to an embodiment.

FIG. 6 illustrates a multi-bit flip-flop according to an embodiment. Specifically, FIG. 6 illustrates a part of the embodiment described with reference to FIG. 4A in a plane view having the x-axis and the y-axis.

With reference to FIGS. 5B to 5D and 6, the first and second inverters 234, 235 or 334, 355, the first output driver 24*a*, and the internal hold buffer 25 included in the first static latch 23*a* may be arranged on the first row R1 in this stated order. The first and second inverters 234, 235 or 334, 355, the first output driver 24*a*, and the internal hold buffer 25 included in the first static latch 23*a* may be implemented by a plurality of transistors. In this specification, transistors may have any structure. For example, transistors may include a fin field effect transistor (FinFET), a multi-bridge channel FET (MBCFET), a vertical FET (VFET), a complementary FET (CFET), a negative FET (NCFET), a carbon nanotube (CNT) FET, etc.

As for the first and second inverters 234, 235 or 334, 334 included in the first static latch 23*a*, a first contact C11, a third contact C13, a first gate electrode G11, and a second gate electrode G12 may be formed on a first active region RX1 and a second active region RX2. A second contact C12 may be formed on the first active region RX1. The second contact C12 may be electrically connected with a pattern to which the positive supply voltage VDD is applied through a via VIA. A fourth contact C14 may be formed on the second active region RX2. The fourth contact C14 may be electrically connected with a pattern to which a negative supply voltage VSS is applied through the via VIA. Each of the first gate electrode G11 and the third contact C13 may be electrically connected with a first wiring layer M1 through the via VIA. Each of the first contact C11 and the second gate electrode G12 may be electrically connected with the first wiring layer M1 through the via VIA.

As for the first output driver 24*a*, a gate electrode G2 and a first contact C21 may be formed on the first active region RX1 and the second active region RX2. A second contact C22 may be formed on the first active region RX1, and be electrically connected with a pattern to which the positive supply voltage VDD is applied. A third contact C23 may be formed on the second active region RX2 and be electrically connected with a pattern to which the negative supply voltage VSS is applied. The first wiring layer M1 connected with the first contact C11 and the second gate electrode G12, and the gate electrode G2 may be electrically connected through the via VIA.

As for the internal hold buffer 25, a first contact C31, a second contact C32, a third contact C33, a fourth contact C34, a first gate electrode G31, and a second gate electrode G32 may be formed identical to the first and second inverters 234, 235 or 334, 335 included in the first static latch 23*a*. Only, the first contact C31 and the second gate electrode G32 may be electrically connected with the first wiring layer M1 through the via VIA. The first gate electrode G31 may be electrically connected with the first wiring layer M1 connected to the gate electrode G2 through the via VIA. Accordingly, a first pattern W1 connecting the first output driver 24*a* to the internal hold buffer 25 may be formed in the first wiring layer M1. The third contact C33 may be electrically connected with a second wiring layer M2 through the via VIA, and the second wiring layer M2 may be electrically connected with a third wiring layer M3 through the via VIA. The third wiring layer M3 may be formed on the second static latch 23*b*, the second output driver 24*b*, and the scan input hold buffer 26. Although it is not shown in the drawings, the third wiring layer M3 may be electrically connected with a terminal where the scan input signal SI is received in the second feedback driver 21*b*. In the second wiring layer M2 and the third wiring layer M3, a second pattern W2 and a third pattern W3 connecting the internal hold buffer 25 and the second flip-flop may be formed.

To minimize capacitance according to a length of a data path, the size of the first pattern W1 connecting the first output driver 24*a* to the internal hold buffer 25 may be minimized. Such as to secure a maximum hold margin by the internal hold buffer 25, the sizes of the second pattern W2 and the third pattern W3 may be maximized.

Figure 7:
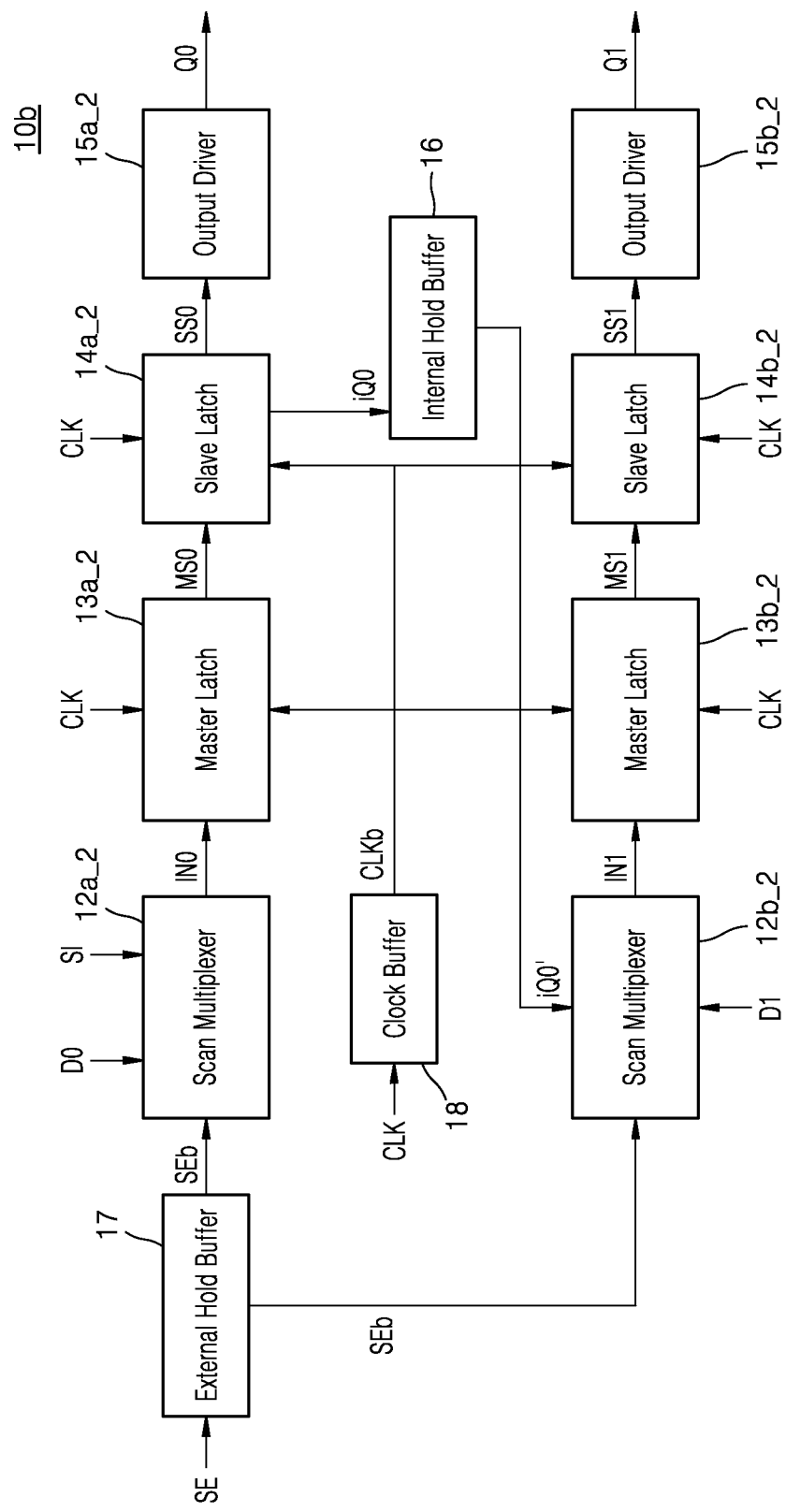
FIG. 7 is a block diagram of a plurality of flip-flops included in a multi-bit flip-flop according to an embodiment.

FIG. 7 illustrates a plurality of flip-flops included in a multi-bit flip-flop according to an embodiment. A multi-bit flip-flop 10*b* of FIG. 7 may be referred to as a master-slave flip-flop.

With reference to FIGS. 2 and 7, the multi-bit flip-flop 10*b* may include the first flip-flop FF0, the second flip-flop FF1, the internal hold buffer 16, and the scan enable hold buffer 17.

The first flip-flop FF0 may include a first selector 12*a*_2, a first master latch 13*a*_2, a first slave latch 14*a*_2, and a first output driver 15*a*_2. Here, the first selector 12*a*_2 may correspond to the first input block 1130 of FIG. 2.

The first selector 12*a*_2 may output, to the first master latch 13*a*_2, the first input signal IN0 corresponding to any one of the first data input signal D0 and the scan input signal SI according to the inverted scan enable signal SEb. The first selector 12*a*_2 may be referred to as a first scan multiplexer or a scan MUX.

The first master latch 13*a*_2 may latch the first input signal IN0 based on the clock signal CLK and the inverted clock signal CLKb, and output a first master signal MS0 to the first slave latch 14*a*_2.

The first slave latch 14*a*_2 may generate the first internal signal iQ0 based on the first master signal MS0, the clock signal CLK, and the inverted clock signal CLKb, and output the first internal signal iQ0 to the internal hold buffer 16. Further, the first slave latch 14*a*_2 may output, to the first output driver 15*a*_2, a first slave signal SS0 corresponding to the first internal signal iQ0.

The first output driver 15a_2 may output the first output signal Q0 based on the first slave signal SS0.

The internal hold buffer 16 may buffer the first internal signal iQ0 and generate the second internal signal iQ0'.

The second flip-flop FF1 may include a second selector 12b_2, a second master latch 13b_2, a second slave latch 14b_2, and a second output driver 15b_2. Here, the second selector 12b_2 may correspond to the second input block IB1 of FIG. 2.

The second selector 12b_2 may output, to the second master latch 13b_2, a second input signal IN1 corresponding to any one of the first internal signal iQ0 and the second data input signal D1 according to the inverted scan enable signal SEb. The second selector 12b_2 may be referred to as a scan multiplexer or a second scan MUX.

The second master latch 13b_2 may latch the second input signal IN1 based on the clock signal CLK and the inverted clock signal CLKb, and output a second master signal MS1 to the second slave latch 14b_2.

The second slave latch 14b_2 may generate the second internal signal iQ0' based on the second master signal MS1, the clock signal CLK, and the inverted clock signal CLKb, and output a second slave signal SS1 corresponding to the second internal signal iQ0' to the second output driver 15b_2.

The first slave latch 14a_2 may generate the first internal signal iQ0 based on the first master signal MS0, the clock signal CLK, and the inverted clock signal CLKb, and output the first internal signal iQ0 to the internal hold buffer 16. Further, the first slave latch 14a_2 may output the first slave signal SS0 corresponding to the first internal signal iQ0 to the first output driver 15a_2.

The second output driver 15b_2 may output the second output signal Q1 based on the second slave signal SS1.

A scan enable hold buffer 17 may be electrically connected with the scan enable pin P3. The scan enable hold buffer 17 may buffer the scan enable signal SE, and output the inverted scan enable signal SEb to the first selector 12a_2 and the second selector 12b_2. The scan enable hold buffer 17 may be referred to as an external hold buffer.

A clock buffer 18 may receive the clock signal CLK and output the inverted clock signal CLKb.

FIGS. 8A to 8H illustrate layout examples of the multi-bit flip-flop of FIG. 7 implemented as a cell.

With reference to FIGS. 8A to 8H, each of multi-bit flip-flops 50a to 50h of FIGS. 8A to 8H may include a first selector 51a, a second selector 51b, a first master latch 52a, a second master latch 52b, a first slave latch 53a, a second slave latch 53b, a first output driver 54a, a second output driver 54b, an internal hold buffer 55, and a scan enable hold buffer 56. The components included in each of the multi-bit flip-flops 50a to 50h of FIGS. 8A to 8H may be implemented by a single cell.

Figure 8A:
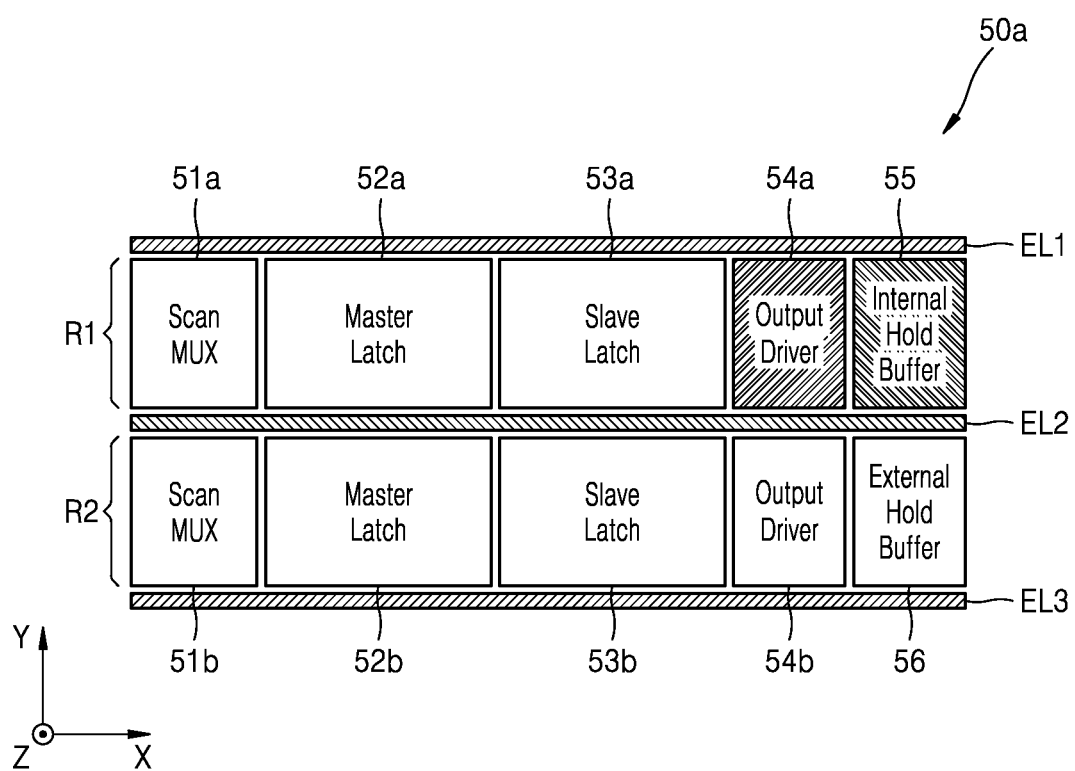
FIGS. 8A to 8H are layout diagrams of the multi-bit flip-flop of FIG. 7 implemented as a cell.

With reference to FIG. 8A, on the first row R1, the first selector 51a, the first master latch 52a, the first slave latch 53a, and the first output driver 54a included in the first flip-flop may be arranged in this stated order. The internal hold buffer 55 may be arranged adjacent to the first output driver 54a. On the second row R2, the second selector 51b, the second master latch 52b, the second slave latch 53b, and the second output driver 54b included in the second flip-flop may be arranged in this stated order. The scan enable hold buffer 56 may be arranged adjacent to the second output driver 54b.

Figure 8B:
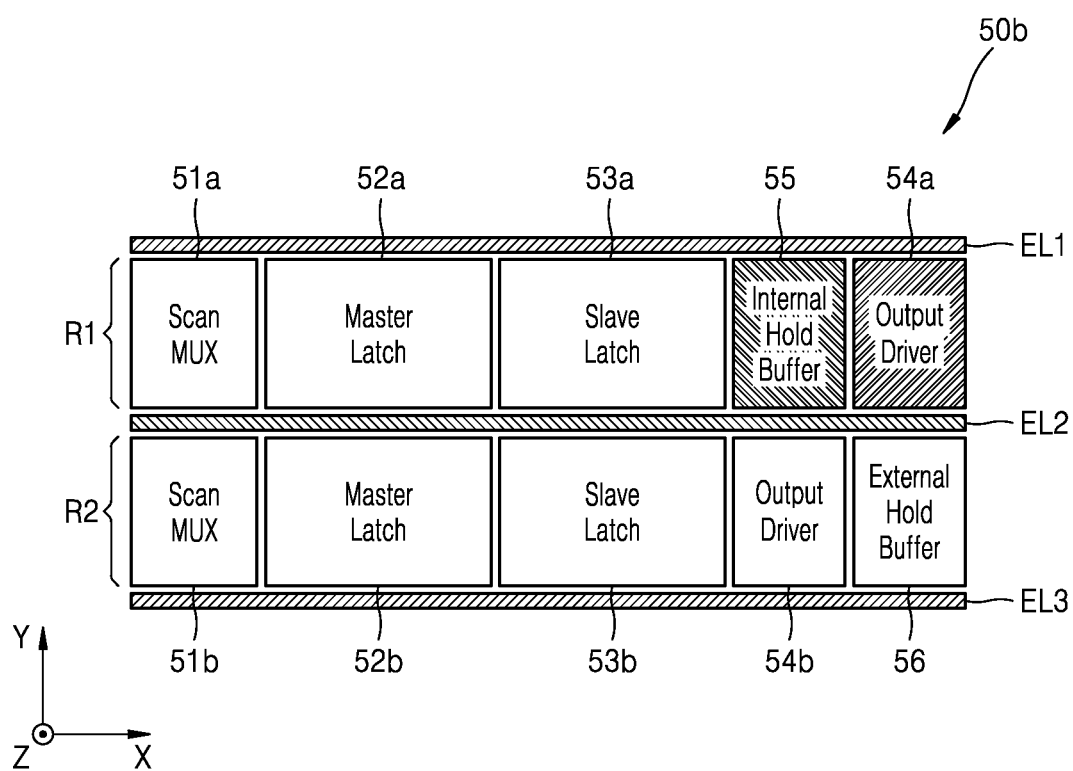
Figure 8C:
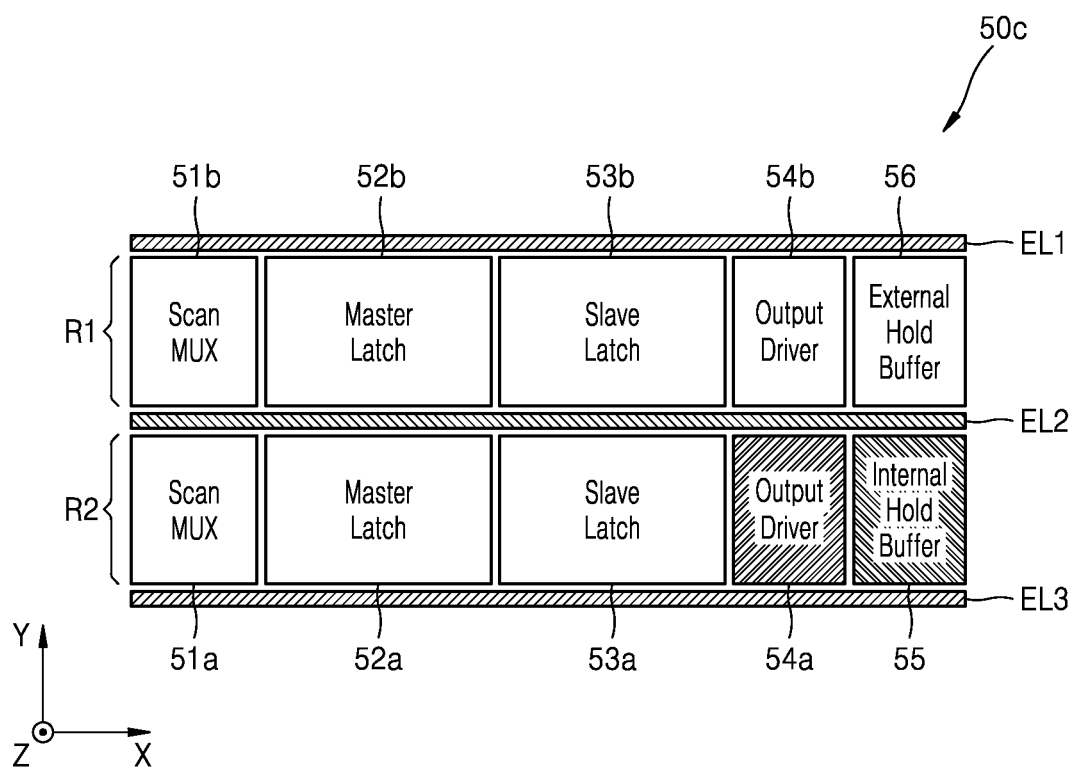
Figure 8D:
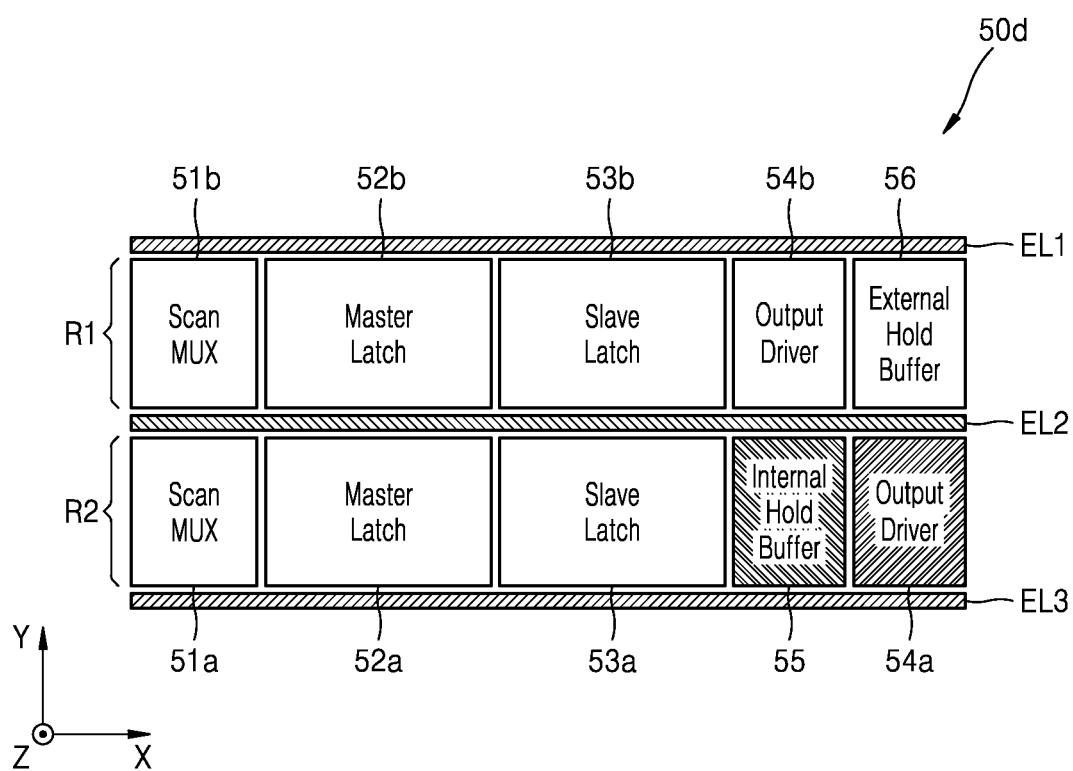
Figure 8E:
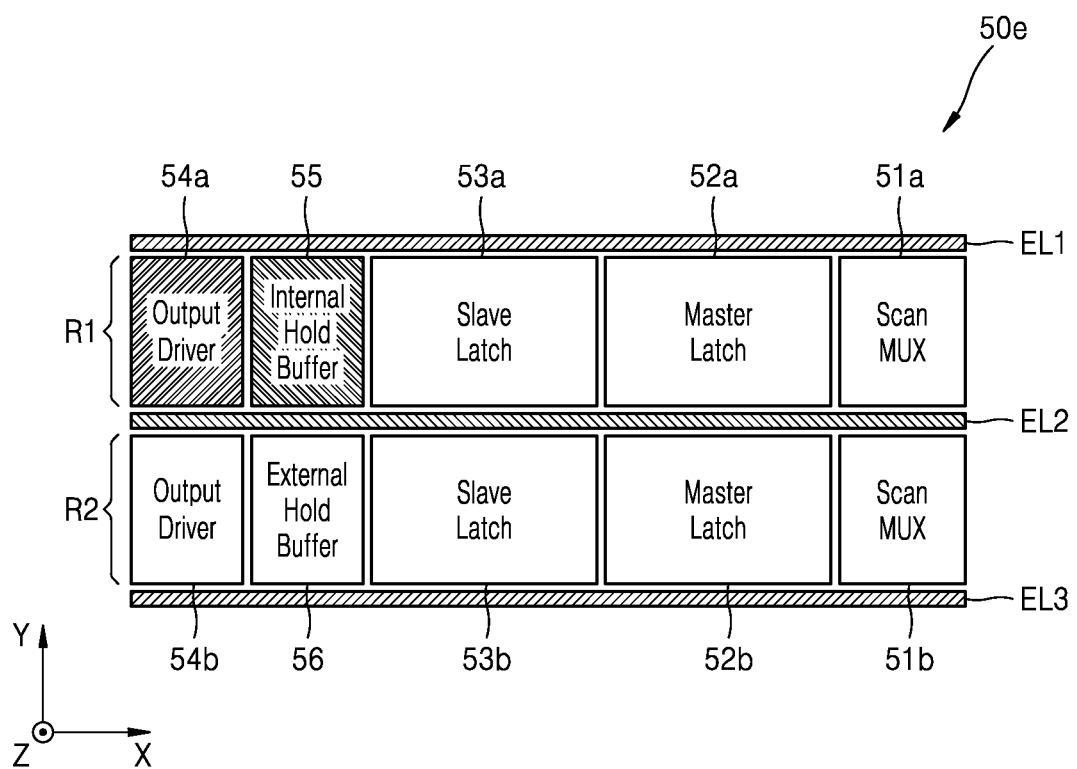
Figure 8F:
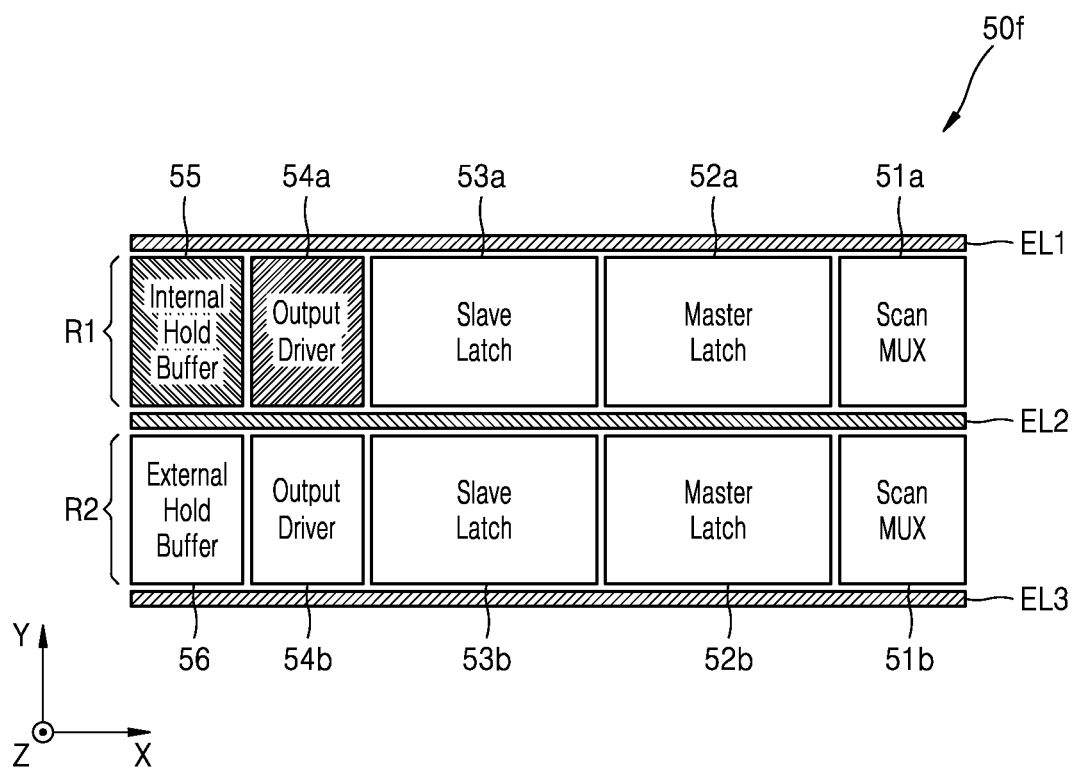
Figure 8G:
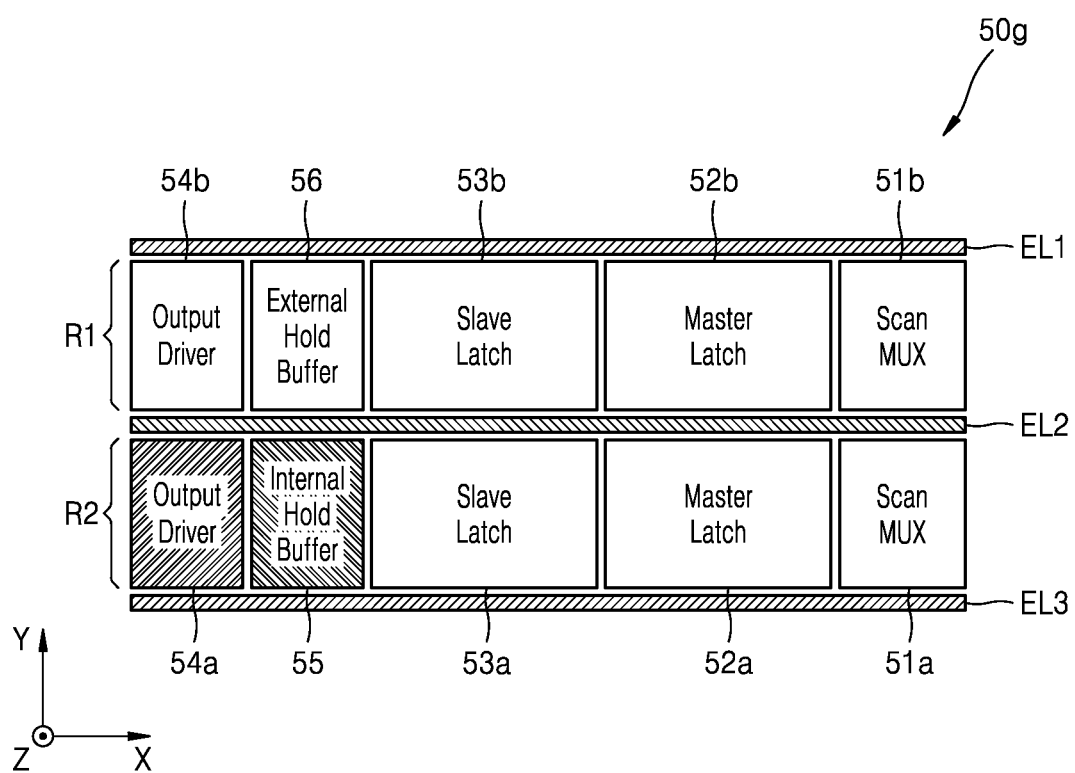
Figure 8H:
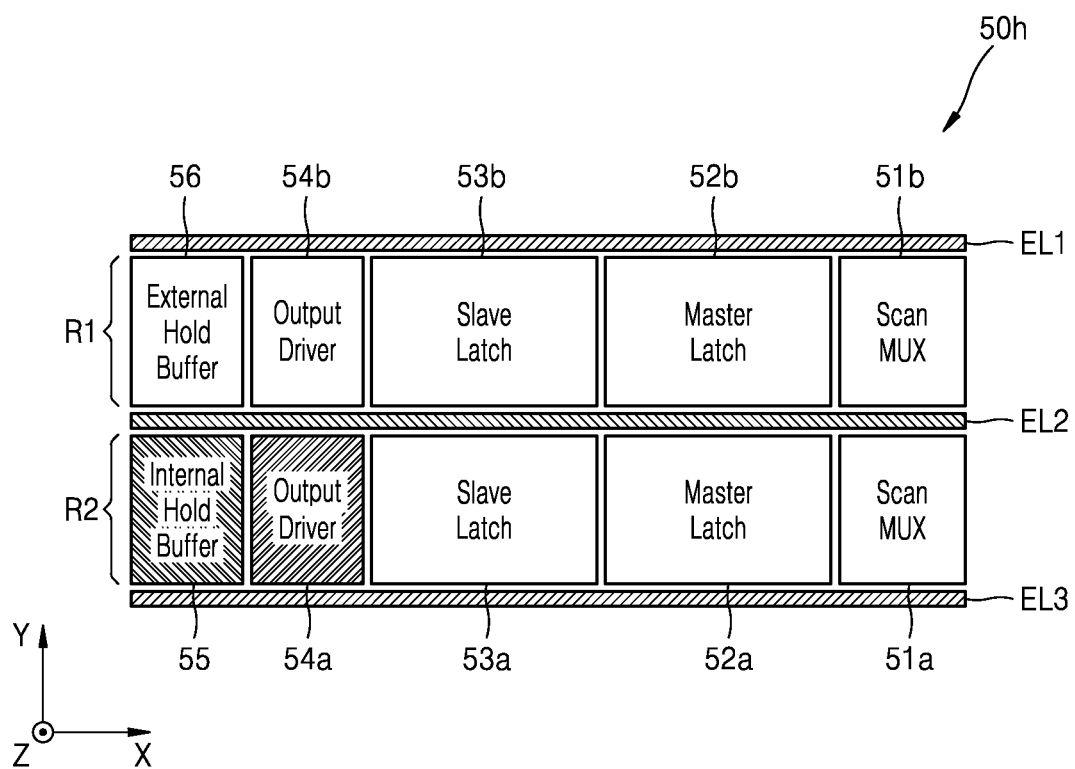

With reference to FIG. 8B, the first slave latch 53a, the internal hold buffer 55, and the first output driver 54a may be arranged in this stated order on the first row R1.

As described above, the multi-bit flop-flop in which the first output driver 54a and the internal hold buffer 55 are arranged adjacent to each other on the same row may be implemented in various ways as illustrated in FIGS. 8C to 8H.

In FIGS. 8A to 8H, although the multi-bit flip-flops 50a to 50h are described as a 2-bit flip-flop, the present disclosure is not limited thereto, and technical ideas of the present disclosure may also be applied to a flip-flop of three or more bits.

Figure 9A:
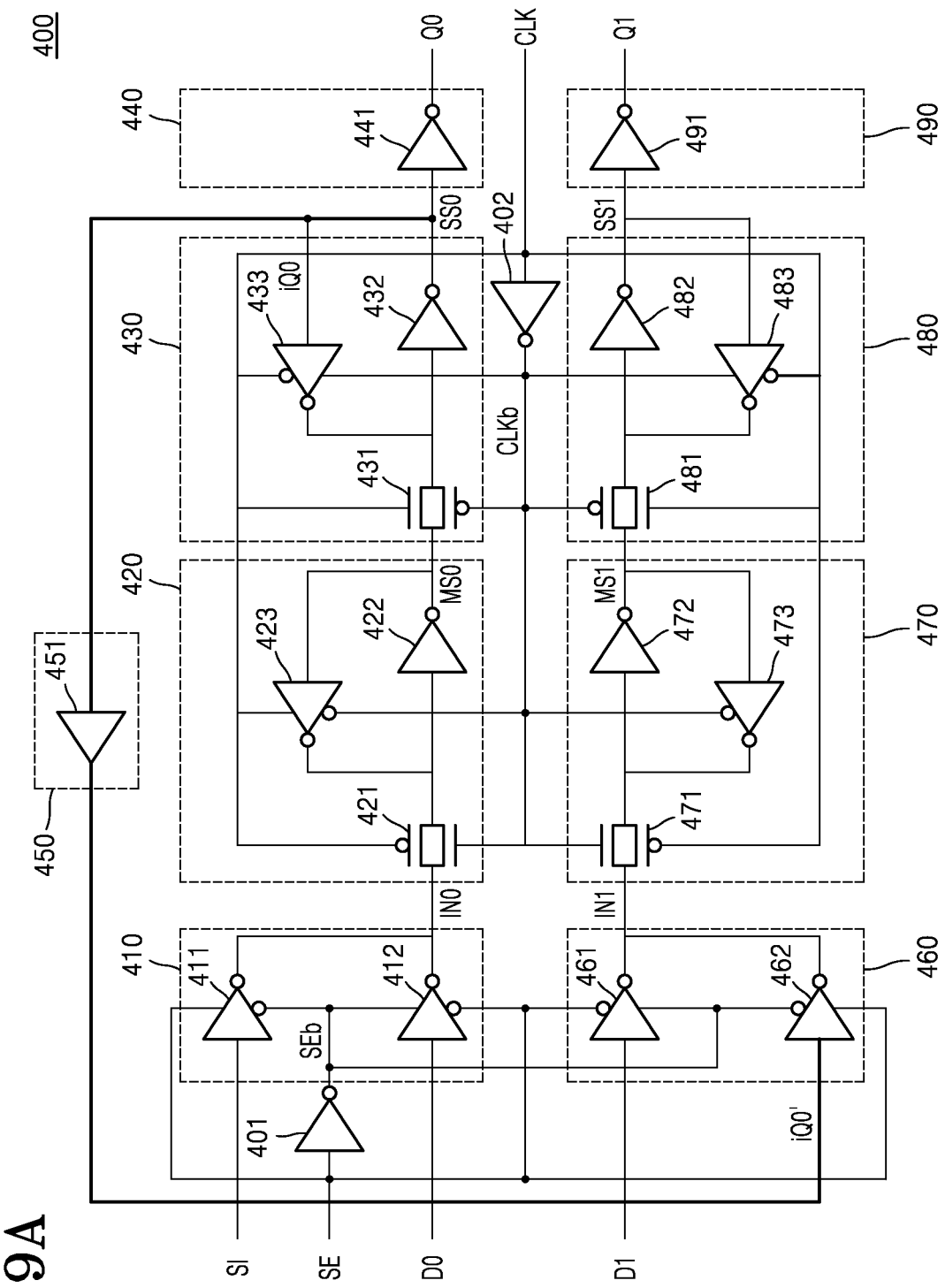
FIGS. 9A to 9B are circuit diagrams of a multi-bit flip-flop according to an embodiment.
Figure 9B:
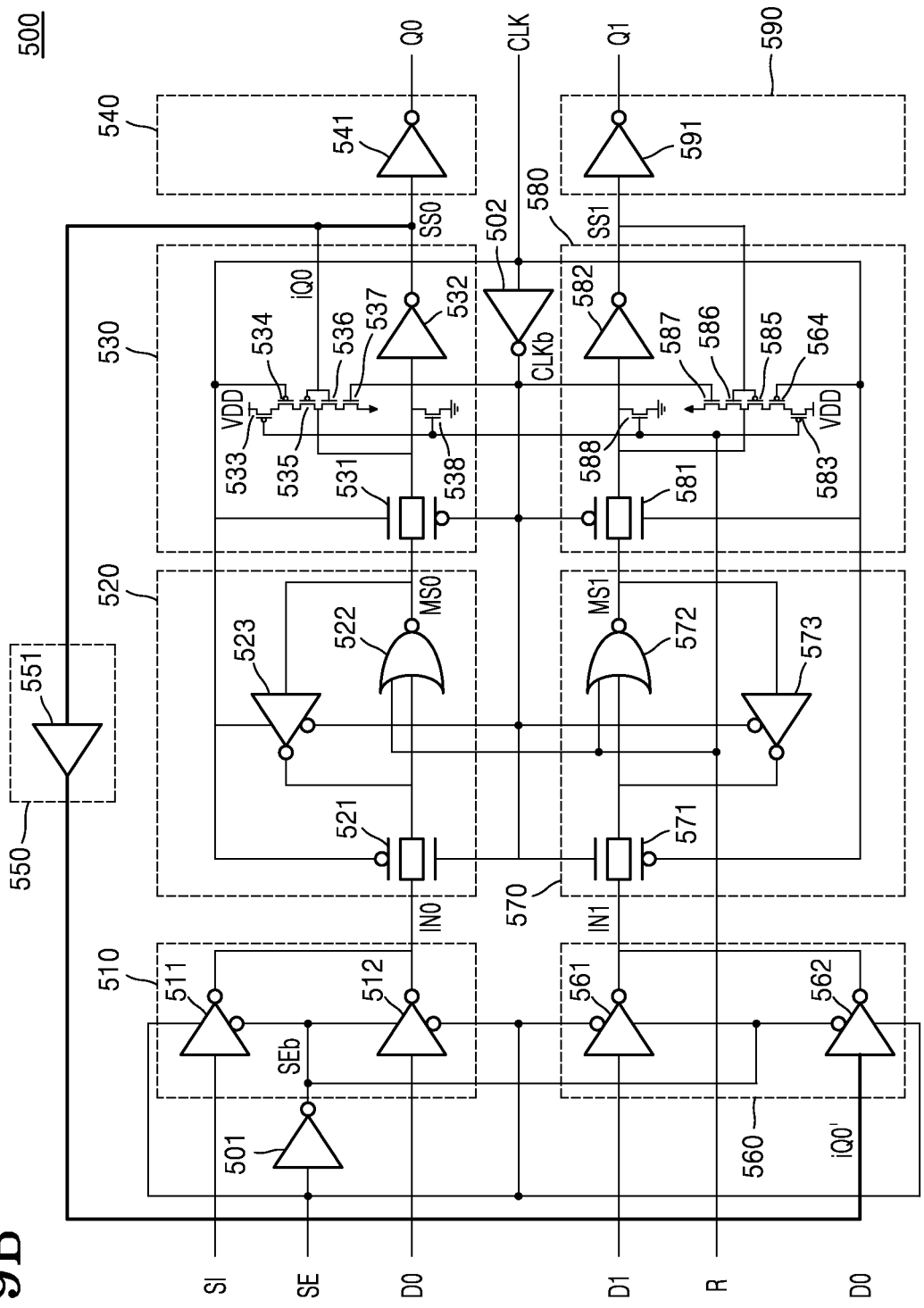

FIGS. 9A to 9B illustrate a multi-bit flip-flop according to an embodiment.

With reference to FIG. 9A, a multi-bit flip-flop 400 may include a scan enable hold buffer 401, a clock buffer 402, a first selection circuit 410, a second selection circuit 460, a first master latch circuit 420, a second master latch circuit 470, a first slave latch 430, a second slave latch 480, a first output driver circuit 440, and a second output driver circuit 490.

The scan enable hold buffer 401 may generate the inverted scan enable signal SEb by buffering the received scan enable signal SE.

The clock buffer 402 may receive the clock signal CLK, and generate the inverted clock signal CLKb by buffering the received clock signal CLK.

In one embodiment the first flip-flop may include a first selection circuit 410, a first master latch circuit 420, a first slave latch circuit 430, and a first output driver circuit 440.

The first selection circuit 410 may correspond to the first input block IB0 of FIG. 2 or the first selector 12a_2 of FIG. 13. The first selection circuit 410 may generate the first input signal IN0. The first selection circuit 410 may include a first input tri-state inverter 411 and a second input tri-state inverter 412. The first input tri-state inverter 411 may receive the scan input signal SI, and output a signal inverted from the scan input signal SI according to the scan enable signal SE and the inverted scan enable signal SEb. The second input tri-state inverter 412 may receive the first data input signal D0, and output a signal inverted from the first data input signal D0 according to the scan enable signal SE and the inverted scan enable signal SEb. Here, the first input signal IN0 may be any one of an output of the first input tri-state inverter 411 and an output of the second input tri-state inverter 412 selected according to the scan enable signal SE.

The first master latch circuit 420 may correspond to the first master latch 13a_2 of FIG. 13. The first master latch circuit 420 may generate the first master signal MS0 by latching the first input signal IN0. The first master latch circuit 420 may include a first transmission gate 421, a first inverter 422, and a first tri-state inverter 423. The first transmission gate 421 may transmit the first input signal IN0 to the first inverter 422 based on the clock signal CLK. Specifically, the first transmission gate 421 may transmit the first input signal IN0 to the first inverter 422 according to the inverted clock signal CLKb. The first inverter 422 may generate the first master signal MS0 by inverting the first input signal IN0. The first tri-state inverter 423 may receive the first master signal MS0, and output a signal inverted from the first master signal MS0 based on the clock signal CLK.

The first slave latch circuit 430 may correspond to the first slave latch 14a_2 of FIG. 13. The first slave latch circuit 430 may generate the first internal signal iQ0 by latching the first master signal MS0. The first slave latch circuit 430 may include a second transmission gate 431, a second inverter 432, and a second tri-state inverter 433. The second transmission gate 431 may transmit the first master signal MS0 to the second inverter 432 based on the clock signal CLK. The second inverter 432 may include a first input terminal and a first output terminal connected to the second transmission gate 431, and generate the first slave signal SS0 by inverting the first master signal MS0. The second tri-state inverter 433 may include a second input terminal connected to the first output terminal and a second output terminal connected to the first input terminal, receive the first slave signal SS0, and output a signal inverted from the first slave signal SS0 based on the clock signal CLK. The first slave signal SS0 may be referred to as the first internal signal iQ0 corresponding to the first output signal Q0.

The first output driver 440 may correspond to the first output driver 15a_2 of FIG. 13. The first output driver circuit 440 may receive the first internal signal iQ0, and generate the first output signal Q0. The first output driver circuit 440 may receive the first slave signal SS0 or the first internal signal iQ0, and generate the first internal output signal Q0. In one embodiment, the first output driver circuit 440 may include a first output inverter 441. The first output inverter 441 may output the first output signal Q0 by inverting the first slave signal SS0.

The first internal signal iQ0 may be used as the scan input signal input to the second selection circuit 460. Accordingly, a scan path of the first selection circuit 410, the first master latch circuit 420, and the first slave latch circuit 430 and a scan path of the second selection circuit 460, the second master latch circuit 470, and the second slave latch circuit 480 may be connected to each other.

The internal hold buffer 450 may receive the first internal signal iQ0, and generate the second internal signal iQ0' by buffering the received first internal signal iQ0. In one embodiment, the internal hold buffer 450 may be implemented by at least one inverter. For example, the internal hold buffer 450 may be implemented by two inverters connected in series. However, the present disclosure is not limited thereto.

In one embodiment, the second flip-flop may include a second selection circuit 460, a second master latch circuit 470, a second slave latch circuit 480, and a second output driver circuit 490.

The second selection circuit 460 may correspond to the second input block IB1 of FIG. 2 or the second selector 12b_2 of FIG. 13. The second selection circuit 460 may generate the second input signal IN1. The second selection circuit 460 may include a third input tri-state inverter 461 and a fourth input tri-state inverter 462. The second selection circuit 460 may use the second internal signal iQ0' as the scan input signal SI.

The second master latch circuit 470 may correspond to the second master latch 13b_2 of FIG. 13. The second master latch circuit 470 may generate the second master signal MS1 by latching the second input signal IN1. The second master latch circuit 470 may include a third transmission gate 471, a fourth inverter 472, and a third tri-state inverter 473.

The second slave latch circuit 480 may correspond to the second slave latch 14b_2 of FIG. 13. The second slave latch circuit 480 may generate a third internal signal by latching the second master signal MS1. The second slave latch circuit 480 may include a fourth transmission gate 481, a fifth inverter 482, and a fourth tri-state inverter 483. The second slave signal 51 may be referred to as the third internal signal corresponding to the second output signal Q1.

The second output driver circuit 490 may correspond to the second output driver 15b_2 of FIG. 13. The second output driver circuit 490 may generate a signal corresponding to the third internal signal (or the second slave signal SS1) as the second output signal Q1. In one embodiment, the second output driver circuit 490 may include the second output inverter 491. The second output inverter 491 may output the second output signal Q1 by inverting the second slave signal SS1.

In some embodiments, the first master latch circuit 420 and the second master latch circuit 470 may include a NOR gate instead of an inverter. In other embodiments, the first master latch circuit 420 and the second master latch circuit 470 may include a NAND gate instead of an inverter. Similarly, each of the first slave latch 430 and the second slave latch 480 may include a first transistor and a second transistor instead of a tri-state inverter.

With reference to FIG. 9B, a multi-bit flip-flop 500 may further include a reset pin (not shown) receiving the reset signal R. The multi-bit flip-flop 500 may include a scan enable hold buffer 501, a clock buffer 502, a first selection circuit 510, a second selection circuit 560, a first master latch circuit 520, a second master latch circuit 570, a first slave latch 530, a second slave latch 580, a first output driver circuit 550, and a second output driver circuit 590. The scan enable hold buffer 501, the clock buffer 502, the first selection circuit 510, the second selection circuit 560, the first output driver circuit 550, the second output driver circuit 590 are as described above with reference to FIG. 9A.

The first master latch circuit 520 may include a first transmission gate 521, a first NOR gate 522, and a first tri-state inverter 523. The first transmission gate 521 and the first tri-state inverter 523 are as described above with reference to FIG. 9B. The first NOR gate 522 may generate the first master signal MS0 based on the first input signal IN0 transmitted from the first transmission gate 521 and the reset signal R received from the reset pin. The first NOR gate 522 may output the first master signal MS0 to the first tri-state inverter 523 and the first slave latch circuit 530.

The first slave latch circuit 530 may include a second transmission gate 531, a second inverter 532, a first transistor 533, a second transistor 534, a third transistor 535, a fourth transistor 536, a fifth transistor 537, and a sixth transistor 538. The second transmission gate 531 and the second inverter 532 are as described above with reference to FIG. 9B. The first transistor 533 may include a gate electrode receiving the reset signal R, a first electrode and a second electrode receiving the positive supply voltage VDD. The second transistor 534 may include a gate electrode receiving the clock signal CLK, a first electrode and a second electrode, which are electrically connected with the second electrode of the first transistor 533. The third transistor 535 and the fourth transistor 536 may include a gate electrode receiving the first internal signal iQ0. The first electrode of the third transistor 535 may be electrically connected with the second electrode of the second transistor 534, and the second electrode of the third transistor 535 may be electrically connected with the first electrode of the fourth transistor 536, an output of the second transmission gate 531 and an input of the second inverter 532. The fifth transistor 537 may include a gate electrode receiving the inverted clock signal CLKb, a first electrode electrically connected with the second electrode of the fourth transistor 536, and a second electrode receiving a second voltage. Here, a level of the second voltage may be lower than a level of the positive supply voltage VDD, and for example, the second voltage may be a ground voltage. However, the present disclosure is not limited thereto. The sixth transistor 538 may include a gate electrode receiving the reset signal R, a first electrode electrically connected with the output of the second transmission gate 531 and the input of the second inverter 532, and a second electrode receiving the second voltage.

The second master latch circuit 570 may include a second transmission gate 571, a second NOR gate 572, and a second tri-state inverter 573. The second NOR gate 572 may generate the second master signal MS1 based on the second input signal IN1 and the reset signal R.

In an alternate embodiment, the NOR gates 522 and 572 may be replaced with AND gates, the inverters 512 and 561 may be removed, and one inverter may be placed on the R line input to the replacement AND gates. Moreover, the replacement AND gates may be replaced with NAND gates if the inverter 532 is moved from the SS0 line to the line for transistors 535 and 536 and the inverter 582 is moved from the SS1 line to the line for transistors 585 and 586.

The second slave latch circuit 580 may include a second transmission gate 581, a second inverter 582, and first to sixth transistors 583 to 588.

Figure 10:
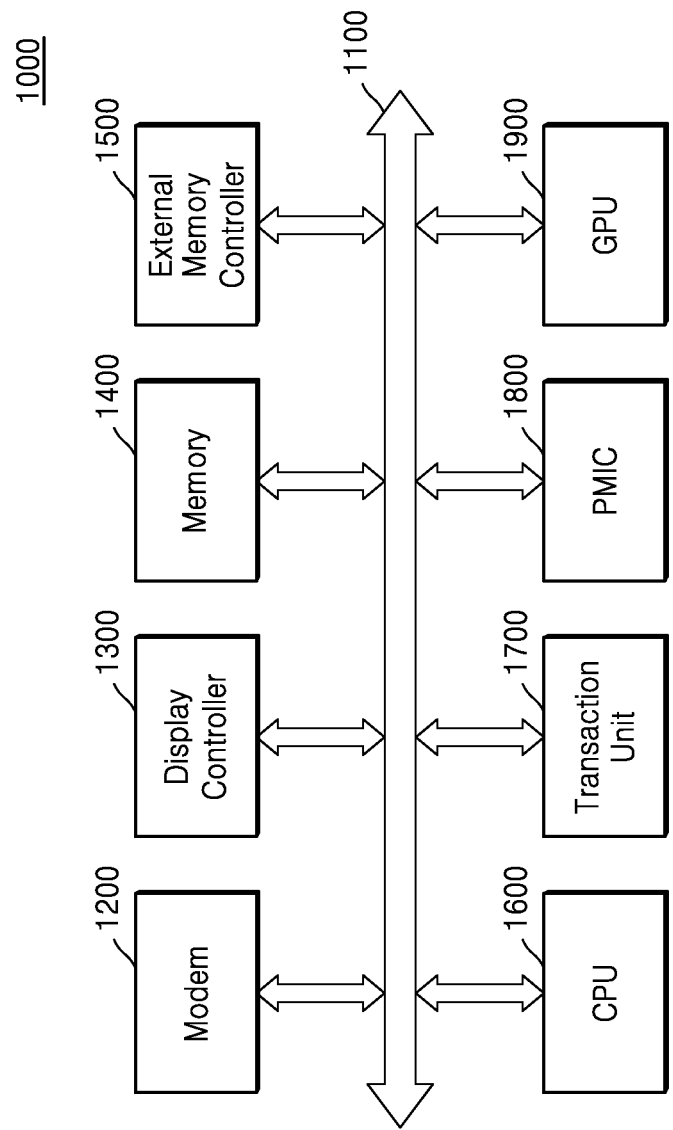
FIG. 10 is a block diagram of a System-on-Chip (SoC) according to an embodiment.

FIG. 10 illustrates a System-on-Chip (SoC) according to an embodiment.

With reference to FIG. 10, the SoC 1000 refers to complex functional blocks such as intellectual properties (IP) performing various functions, implemented in a single chip. According to an embodiment, the multi-bit flip-flop including the first output driver and the internal hold buffer arranged adjacent to each other may be designed, and the SoC 1000 including such multi-bit flip-flop may also be designed. The SoC 1000 may include a modem 1200, a display controller 1300, a memory 1400, an external memory controller 1500, a central processing unit (CPU) 1600, a transaction unit 1700, a PMIC 1800, and a graphic processing unit (GPU) 1900, and each functional block of the SoC 1000 may communicate with each other through a bus 1100.

The CPU 1600 which may control operations of the SoC 1000 at the highest level may control operations of other functional blocks 1200 to 1900. The modem 1200 may demodulate signals received from the outside of the SoC 1000, or modulate signals generated inside the SoC 1000 to transmit the modulated signals to the outside. The external memory controller 1500 may control operations of receiving and transmitting data from the external memory device connected to the SoC 1000. For example, a program and/or data stored in the external memory device may be provided to the CPU 1600 or the GPU 1900 under the control of the controller 1500. The GPU 1900 may execute program instructions related to graphic processing. The GPU 1900 may receive graphic data via the external memory controller 1500, and the graphic data processed by the GPU 1900 may be transmitted to the outside of the SoC 1000 through the external memory controller 1500. The transaction unit 1700 may monitor data transactions of each functional block, and the PMIC 1800 may control power supplied to each function block according to the control of the transaction unit 1700. The display controller 1300 may transmit data generated inside the SoC 1000 to a display by controlling the display (or a display device) outside the SoC 1000. The memory 1400 may include a non-volatile memory such as electrically erasable programmable read-only memory (EEPROM), a flash memory, etc., or a volatile memory, such as dynamic random access memory (DRAM), static random access memory (SRAM), etc.

While the present disclosure has been particularly shown and described with reference to embodiments thereof, it will be understood that various changes in form and details may be made therein by those of ordinary skill in the pertinent art without departing from the spirit and scope of the disclosure as set forth in the following claims.

What is claimed is:

1. A multi-bit flip-flop comprising:
    a scan input pin;
    a first data input pin;
    a second data input pin;
    a first output pin;
    a second output pin;
    a first flip-flop arranged on a first row, including a first input buffer electrically connected with the scan input pin and the first data input pin, and a first output driver electrically connected with the first output pin;
    a second flip-flop arranged on a second row different than the first row, including a second input buffer electrically connected with the second data input pin, and a second output driver electrically connected with the second output pin;
    an internal hold buffer electrically connected to the first output driver on the first row and the second input buffer on the second row; and
    a scan enable pin configured to receive a scan enable signal indicative of a scan mode,
    wherein the internal hold buffer is configured to provide a scan output of the first flip-flop to the second flip-flop in the scan mode,
    wherein the internal hold buffer is arranged adjacent to the first output driver on the first row,
    wherein the first flip-flop further comprises:
        a first feedback driver configured to generate a first feedback signal based on a scan input signal output from the scan input pin, the scan enable signal, and a first dynamic feedback signal;
        a first dynamic logic driver arranged adjacent to the first feedback driver, and configured to generate the first dynamic feedback signal based on a first data input signal output from the first data input pin, the scan enable signal, and the first feedback signal; and
        a first static latch arranged adjacent to the first dynamic logic driver, and configured to output a first internal signal generated based on the first dynamic feedback signal to the internal hold buffer and the first output driver.

2. The multi-bit flip-flop of claim 1, wherein the first static latch, the first output driver, and the internal hold buffer are arranged on the first row in this stated order.

3. The multi-bit flip-flop of claim 1, wherein the first static latch, the internal hold buffer, and the first output driver are arranged on the first row in this stated order.

4. The multi-bit flip-flop of claim 1, wherein the second flip-flop further comprises:
    a second feedback driver configured to generate a second feedback signal based on an internal signal buffered by the internal hold buffer, the scan enable signal, and a second dynamic feedback signal;
    a second dynamic logic driver arranged adjacent to the second feedback driver, and configured to generate the second dynamic feedback signal based on a second data input signal output from the second data input pin, the scan enable signal, and the second feedback signal; and
    a second static latch arranged adjacent to the second dynamic logic driver, and configured to output a second internal signal generated based on the second dynamic feedback signal to the second output driver.

5. The multi-bit flip-flop of claim 4, further comprising a scan input hold buffer arranged adjacent to the second output driver on the second row and electrically connected with the scan input pin.

6. A multi-bit flip-flop comprising:
- a scan input pin configured to receive a scan input signal;
- a clock pin configured to receive a clock signal;
- a scan enable pin configured to receive a scan enable signal indicative of a scan mode;
- a plurality of data input pins configured to receive a plurality of data input signals including at least a first data input signal and a second data input signal, respectively;
- a first flip-flop configured to generate a first input signal corresponding to any one of the scan input signal and the first data input signal according to the scan enable signal, generate a first internal signal by latching the first input signal, and output a first output signal corresponding to the first internal signal;
- an internal hold buffer configured to generate a second internal signal by buffering the first internal signal;
- a second flip-flop configured to generate a second input signal corresponding to any one of the second internal signal and the second data input signal according to the scan enable signal, and generate a second output signal based on the second input signal; and
- a plurality of output pins configured to output a plurality of output signals including at least the first output signal and the second output signal, respectively,
- wherein the internal hold buffer comprises an input terminal, a first inverter connected to the input terminal, a second inverter exclusively connected in series with the first inverter, and an output terminal connected to the second inverter, and is configured to provide a scan output of the first flip-flop, indicative of a first bit, to the second flip-flop, indicative of a second bit consecutive to the first bit, in the scan mode.

7. The multi-bit flip-flop of claim 6, further comprising:
- a first pattern connecting the first output driver to the internal hold buffer in a first wiring layer; and
- a second pattern and a third pattern connecting the internal hold buffer to the second flip-flop in a second wiring layer and a third wiring layer.

8. The multi-bit flip-flop of claim 6, wherein the first flip-flop further comprises:
- a first selection circuit configured to generate the first input signal;
- a first master latch circuit configured to generate a first master signal by latching the first input signal;
- a first slave latch circuit configured to generate a first internal signal by latching the first master signal; and
- a first output driver circuit configured to receive the first internal signal, and generate the first output signal.

9. The multi-bit flip-flop of claim 8, wherein the second flip-flop further comprises:
- a second selection circuit configured to generate the second input signal;
- a second master latch circuit configured to generate a second master signal by latching the second input signal;
- a second slave latch circuit configured to generate a third internal signal by latching the second master signal; and
- a second output driver circuit configured to generate a signal corresponding to the third internal signal as the second output signal.

10. The multi-bit flip-flop of claim 9, further comprising a scan enable hold buffer configured to buffer the scan enable signal and output the buffered signal to the first selection circuit and the second selection circuit.

11. The multi-bit flip-flop of claim 6,
wherein the first flip-flop comprises:
- a first selector configured to select the first input signal corresponding to any one of the scan input signal output from the scan input pin and the first data input signal output from a first of the plurality of data input pins, according to the scan enable signal;
- a first master latch arranged adjacent to the first selector and configured to generate a first master signal by latching the first input signal; and
- a first slave latch configured to output a first internal signal generated based on the first master signal to the internal hold buffer and a first output driver.

12. The multi-bit flip-flop of claim 11, wherein the first slave latch, the first output driver, and the internal hold buffer are arranged on a first row comprising the first flip-flop in this stated order.

13. The multi-bit flip-flop of claim 11, wherein the first slave latch, the internal hold buffer, and the first output driver are arranged on a first row comprising the first flip-flop in this stated order.

14. The multi-bit flip-flop of claim 11, wherein the second flip-flop comprises:
- a second selector configured to select the second input signal corresponding to any one of an internal signal buffered by the internal hold buffer and a second data input signal output from a second of the plurality of data input pins, according to the scan enable signal;
- a second master latch arranged adjacent to the second selector and configured to generate a second master signal by latching the second input signal; and
- a second slave latch configured to output a second internal signal generated based on the second master signal to a second output driver.

15. The multi-bit flip-flop of claim 14, further comprising a scan enable hold buffer arranged adjacent to the second output driver on a second row comprising the second flip-flop and electrically connected with the scan enable pin.

16. A multi-bit flip-flop comprising:
- a scan input pin configured to receive a scan input signal;
- a clock pin configured to receive a clock signal;
- a scan enable pin configured to receive a scan enable signal;
- a plurality of data input pins configured to receive a plurality of data input signals including at least a first data input signal and a second data input signal, respectively;
- a first flip-flop configured to generate a first input signal corresponding to any one of the scan input signal and the first data input signal according to the scan enable signal, generate a first internal signal by latching the first input signal, and output a first output signal corresponding to the first internal signal;
- an internal hold buffer configured to generate a second internal signal by buffering the first internal signal;
- a second flip-flop configured to generate a second input signal corresponding to any one of the second internal signal and the second data input signal according to the scan enable signal, and generate a second output signal based on the second input signal; and
- a plurality of output pins configured to output a plurality of output signals including at least the first output signal and the second output signal, respectively, wherein the internal hold buffer is arranged adjacent to the first flip-flop and an output pin from which the first output signal is output, among the plurality of output pins, wherein the first flip-flop further comprises:
- a first feedback driver circuit configured to generate a first feedback signal based on the clock signal, the scan input signal, and the scan enable signal;
- a first dynamic logic driver circuit configured to generate the first input signal based on the first feedback signal, the first data input signal, and the scan enable signal, and generate a first dynamic feedback signal corresponding to the first input signal;
- a first static latch circuit configured to generate the first internal signal based on the first dynamic feedback signal; and
- a first output driver circuit configured to receive the first internal signal, and generate the first output signal.

17. The multi-bit flip-flop of claim 16, wherein the second flip-flop further comprises:
- a second feedback driver circuit configured to generate a second feedback signal based on the clock signal, the second internal signal, and the scan enable signal;
- a second dynamic logic driver circuit configured to generate the second input signal based on the second feedback signal, the second data input signal, and the scan enable signal, and generate a second dynamic feedback signal corresponding to the second input signal;
- a second static latch circuit configured to generate a third internal signal based on the second dynamic feedback signal; and
- a second output driver circuit configured to generate a signal corresponding to the third internal signal as the second output signal.

18. The multi-bit flip-flop of claim 17, wherein the internal hold buffer comprises:
- a first inverter including an input terminal electrically connected between an output terminal of the first static latch circuit and an input terminal of the first output driver circuit; and
- a second inverter connected with the first inverter in series and including an output terminal electrically connected with an input terminal of the second feedback driver circuit.

19. The multi-bit flip-flop of claim 18, further comprising a scan input hold buffer configured to buffer the scan input signal and output the buffered signal to the first feedback driver circuit.

* * * * *